US012787438B2

(12) United States Patent
Lim et al.

(10) Patent No.: US 12,787,438 B2
(45) Date of Patent: Nov. 3, 2026

(54) PIXEL AND DISPLAY DEVICE INCLUDING THE SAME

(71) Applicant: LG Display Co., Ltd., Seoul (KR)

(72) Inventors: MyungSub Lim, Seoul (KR); SungJoon Min, Goyang-si (KR); HaeYoon Jung, Seoul (KR); Sujin Ham, Seoul (KR); YuRa Jeong, Seoul (KR); Heewon Kim, Hwaseong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 528 days.

(21) Appl. No.: 18/243,939

(22) Filed: Sep. 8, 2023

(65) Prior Publication Data

US 2024/0136363 A1 Apr. 25, 2024

(30) Foreign Application Priority Data

Oct. 12, 2022 (KR) ........................ 10-2022-0130488

(51) Int. Cl.

*H10D 86/60* (2025.01)
*H10D 86/40* (2025.01)
*H10W 90/00* (2026.01)

(52) U.S. Cl.

CPC ........... *H10D 86/60* (2025.01); *H10D 86/441* (2025.01); *H10W 90/00* (2026.01)

(58) Field of Classification Search

CPC .... H10D 86/60; H10D 86/441; H10D 86/481; H10D 86/471; H10W 90/00; G09G 3/32; G09G 3/3208; G09G 3/3266; G09G 3/3607; G09G 2300/0426; G09G 2300/0842

See application file for complete search history.

(56) References Cited

U.S. PATENT DOCUMENTS

| | | | | |
|---|---|---|---|---|
| 2017/0084220 A1 | 3/2017 | Im | | |
| 2019/0172396 A1 | 6/2019 | Yang et al. | | |
| 2020/0118494 A1* | 4/2020 | Park | G09G 3/3258 | |
| 2020/0312244 A1* | 10/2020 | Yang | G09G 3/3275 | |
| 2021/0027671 A1* | 1/2021 | Lee | G09F 9/301 | |

FOREIGN PATENT DOCUMENTS

| | | | |
|---|---|---|---|
| CN | 108231007 | A | 6/2018 |
| CN | 110473496 | A | 11/2019 |
| CN | 111048024 | A | 4/2020 |
| CN | 113129818 | A | 7/2021 |
| KR | 10-2013-0062573 | A | 6/2013 |
| KR | 10-2020-0041208 | A | 4/2020 |

* cited by examiner

*Primary Examiner* — Brent D Castiaux

(74) *Attorney, Agent, or Firm* — Birch, Stewart, Kolasch & Birch, LLP

(57) ABSTRACT

A pixel can include a light emitting diode; a driving transistor including a gate electrode connected to a first node between a high potential voltage line and a second node, the driving transistor being configured to drive the light emitting diode; a storage capacitor connected between the first node and a third node; a first transistor connected between the third node and a data line, the first transistor including a gate electrode connected to a scan signal line; a second transistor connected between the first node and the second node, and including a gate electrode connected to the scan signal line; a third transistor connected between the third node and a fourth node, the third transistor including a gate electrode connected to an emission signal line. Also, the pixel can include a voltage divider configured to internally generate a reference voltage and output the reference voltage to the fourth node.

25 Claims, 15 Drawing Sheets

PIXEL AND DISPLAY DEVICE INCLUDING THE SAME

CROSS-REFERENCE TO RELATED APPLICATIONS

This application claims priority to Korean Patent Application No. 10-2022-0130488 filed on Oct. 12, 2022, in the Republic of Korea, the entirety of which is hereby expressly incorporated by reference into the present application.

BACKGROUND

Field

The present disclosure relates to a pixel and a display device including the same.

Discussion of the Related Art

Among various display devices which are used for a monitor of a computer, a television, a cellular phone, or the like, there are an organic light emitting display (OLED) device which is a self-emitting device (e.g., no backlight unit), a liquid crystal display (LCD) device which requires a separate light source, and the like.

An applicable range of the display device is diversified to personal digital assistants as well as monitors of computers and televisions and a display device with a large display area and a reduced volume and weight is being studied.

Further, recently, a display device which is manufactured by forming a display unit, a wiring line, and the like on a flexible substrate, such as plastic, which is a flexible material to be stretchable in a specific direction and changed in various forms is getting attention as a next generation display device.

However, flexible display devices have numerous wiring lines connected to each pixel unit, which crowds the space between pixels and provides many potential points of failure due to cracking during flexing, which reduces the reliability and lifespan of the device, and impairs the aspect ratio and restricts the design freedom.

Thus, a need exists for providing a flexible or stretchable display device that has improved flexibility, improved reliability and lifespan, improved aspect ratio and can save space between pixels and provide more design freedom.

SUMMARY OF THE DISCLOSURE

An object to be achieved by the present disclosure is to provide a pixel which minimizes the number of connection lines and a display device including the same.

Another object to be achieved by the present disclosure is to provide a pixel which improves an aperture ratio of a display panel and a display device including the same.

Another object to be achieved by the present disclosure is provide a flexible and stretchable display device, in which each pixel unit can be implemented in a rigid island type shape or structure made of multiple layers with flexible material located between each of the island shapes, and the number of wiring lines connected to each island structure can be minimized, more space can be allocated to those wiring lines to allow for a wavy or coiled shape that can provide more flexibility and the chances of one of those wiring lines being damaged or cracked during stretching and flexing can be reduced. Also, a row of pixels (e.g., a row of island shaped structures) can be commonly controlled by only one scan line, commonly controlled by only one emission line, and each sub pixel in the row of pixels can have a specific circuit design that can internally generate its own reference voltage Vref, which eliminates the need for a separate wiring line to externally provide the reference voltage Vref. In this way, the number of wiring lines connected to each pixel (e.g., each island shape structure) can be drastically reduced, and since there are fewer wiring lines, the aperture ratio can be improved and the chances of one of those wiring lines cracking or being damaged during stretching and flexing is substantially reduced, since there are fewer wiring lines (e.g., fewer potential points of failure).

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a pixel includes a light emitting diode; a driving transistor which includes a gate electrode connected to a first node, is connected between a high potential voltage line and a second node, configured to generate a driving current flowing from the high potential voltage line to a low potential voltage line by means of the light emitting diode; a storage capacitor connected between the first node and a third node; a first transistor which is connected between the third node and a data line and includes a gate electrode connected to a scan signal line; a second transistor which is connected between the first node and the second node and includes a gate electrode connected to the scan signal line; a third transistor which is connected between the third node and a fourth node and includes a gate electrode connected to emission signal line; and a voltage divider which is connected between the high potential voltage line and the low potential voltage line and divides a voltage corresponding to a difference between the high potential voltage supplied to the high potential voltage line and the low potential voltage supplied to the low potential voltage line to generate a reference voltage and outputs the reference voltage to the fourth node.

In order to achieve the above-described objects, according to an aspect of the present disclosure, a display device includes a stretchable lower substrate; a pattern layer which is disposed on the lower substrate and includes a plurality of plate patterns and a plurality of line patterns; a plurality of pixels which is disposed above each of the plurality of plate patterns; and a plurality of connection lines which is disposed above each of the plurality of line patterns to connect the plurality of pixels. Each pixel circuit formed in the plurality of pixels can include a voltage divider connected between the high potential voltage line and the low potential voltage line.

Other detailed matters of the example embodiments are included in the detailed description and the drawings.

According to the present disclosure, the number of stretching lines is minimized so that the stretching rate and the stretching reliability can be improved.

According to the present disclosure, the number of signal lines and voltage lines required to drive the pixel is minimized so that the aperture ratio of the display panel can be improved.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
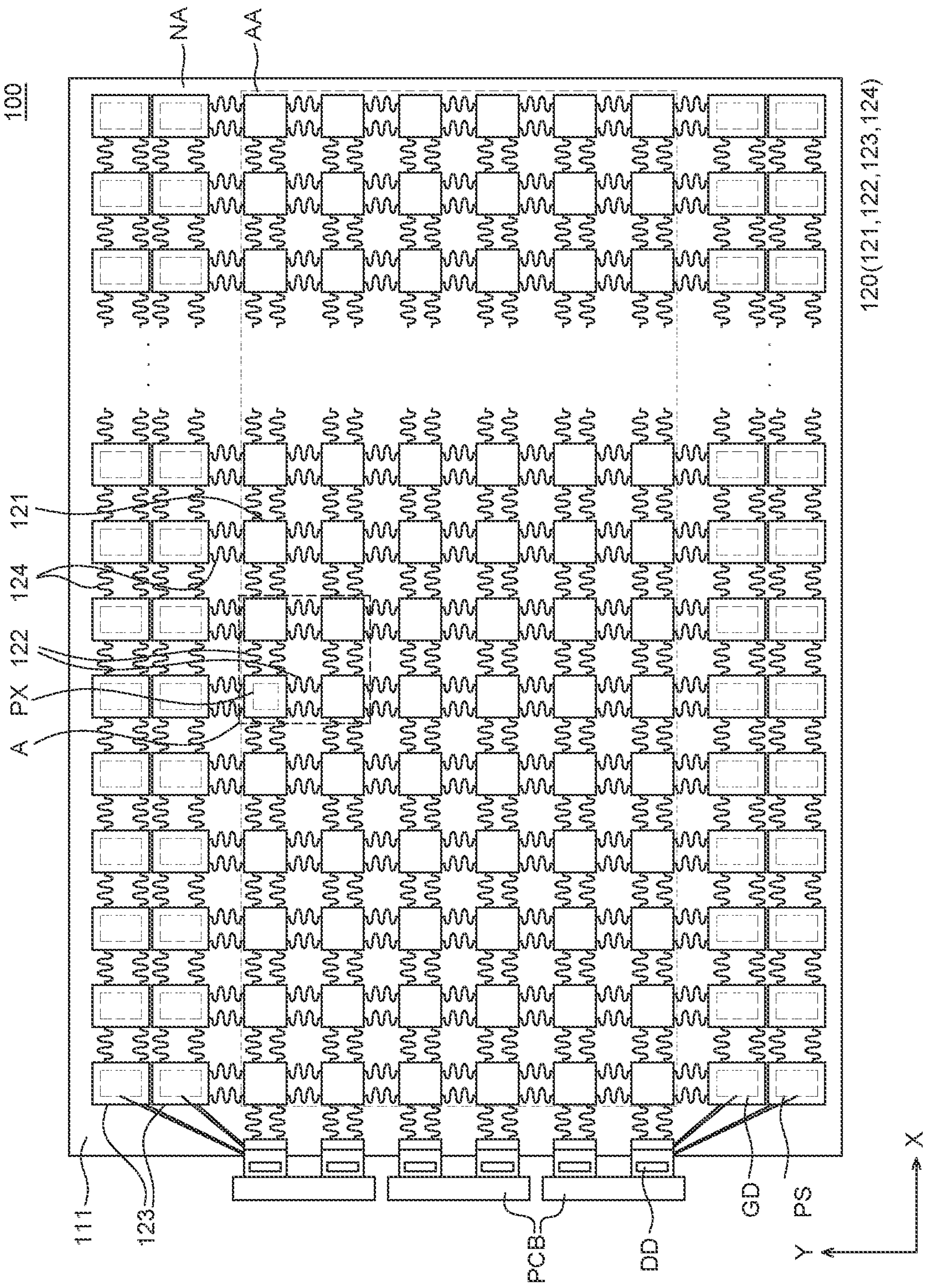
FIG. 1 is a plan view illustrating a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only." Any references to singular can include plural unless expressly stated otherwise.

Components are interpreted to include an ordinary error range even if not expressly stated.

When the position relation between two parts is described using the terms such as "on," "above," "below," and "next," one or more parts can be positioned between the two parts unless the terms are used with the term "immediately" or "directly."

When an element or layer is disposed "on" another element or layer, another layer or another element can be interposed directly on the other element or therebetween.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

A display device according to an example embodiment of the present disclosure is a display device which is capable of displaying images even in a bent or extended state and can also be referred to as a stretchable display device, a flexible display device and an extendable display device. As compared with the general display devices of the related art, the display device has not only a high flexibility, but also stretchability. Therefore, the user can bend or extend a display device and a shape of a display device can be freely changed in accordance with manipulation of a user. For example, when the user pulls the display device by holding ends of the display device, the display device can be extended to the pulling direction of the user. Alternatively, when the user disposes the display device on an outer surface which is not flat, the display device can be disposed to be bent in accordance with the shape of the outer surface of the wall. Further, when a force applied by the user is removed, the display device can return to its original shape.

Stretchable Substrate and Pattern Layer

FIG. 1 is a plan view illustrating a display device according to an example embodiment of the present disclosure.

Figure 2:
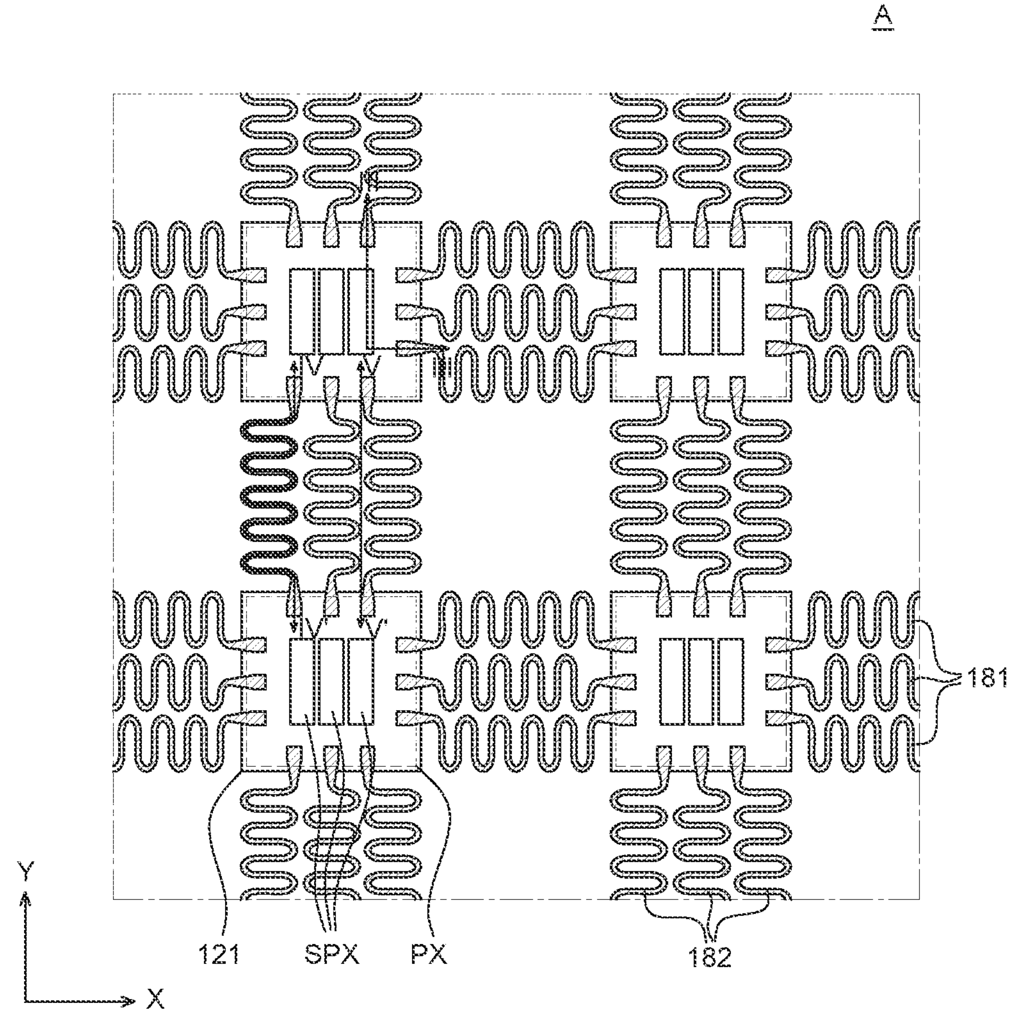
FIG. 2 is an enlarged plan view of an active area of a display device according to an example embodiment of the present disclosure.

FIG. 2 is an enlarged plan view of an active area of a display device according to an example embodiment of the present disclosure.

Figure 3:
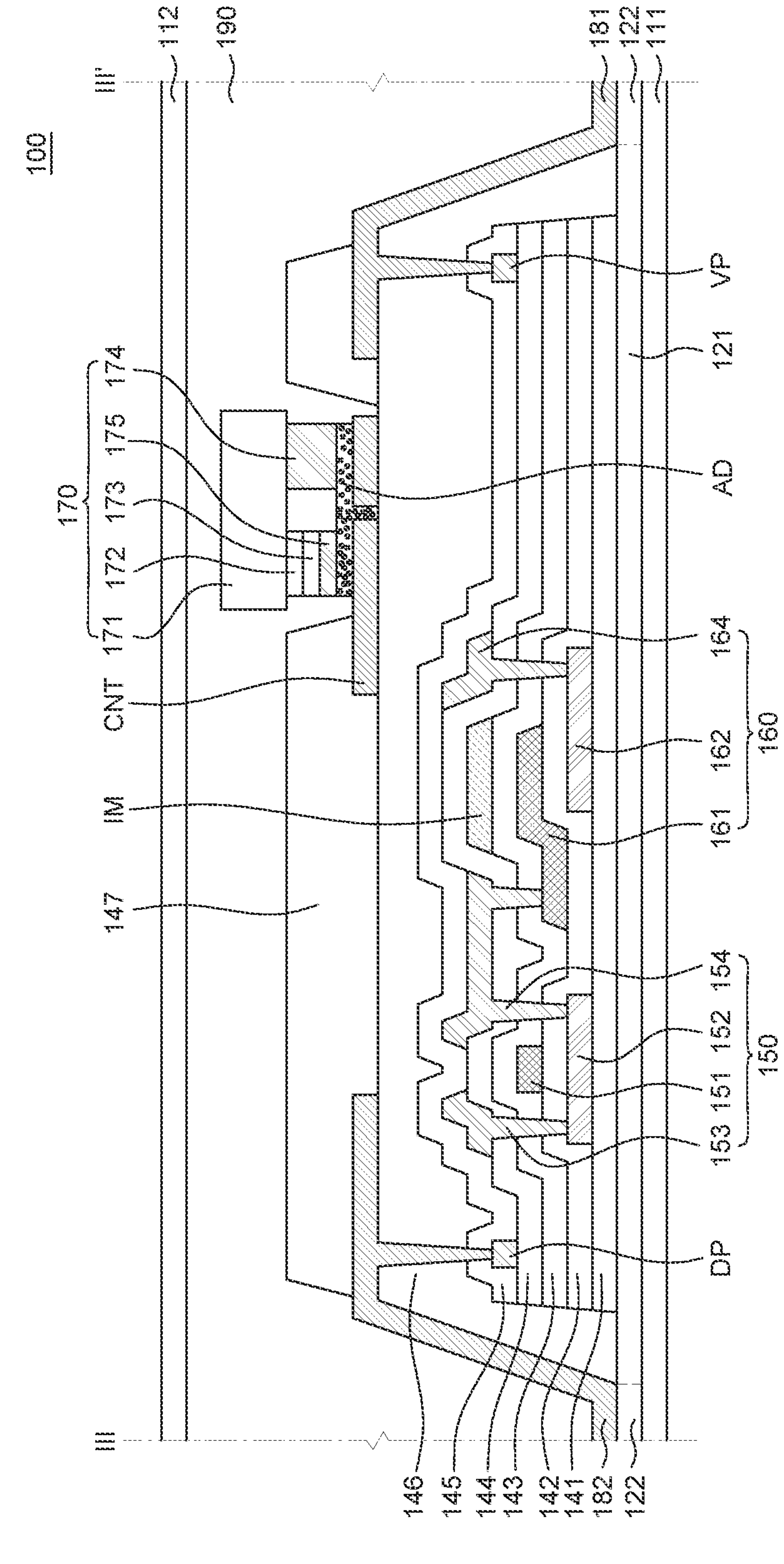
FIG. 3 is a cross-sectional view taken along the line of FIG. 2 according to an example embodiment of the present disclosure.

FIG. 3 is a cross-sectional view taken along the line III-III' of FIG. 2 according to an example embodiment of the present disclosure.

Specifically, FIG. 2 is an enlarged plan view of an area A illustrated in FIG. 1.

Referring to FIG. 1, a display device 100 according to an example embodiment of the present disclosure can include a lower substrate 111, a pattern layer 120, a plurality of pixels PX, a gate driver GD, a data driver DD, and a power supply PS. Further referring to FIG. 3, in the example embodiment, the display device 100 can further include a filling layer 190 and an upper substrate 112.

The lower substrate 111 is a substrate which supports and protects several components of the display device 100. The upper substrate 112 is a substrate which covers and protects several components of the display device 100. For example, the lower substrate 111 is a substrate which supports the pattern layer 120 on which the pixels PX, the gate driver GD, and the power supply PS are formed. The upper substrate 112 is a substrate which covers the pixels PX, the gate driver GD, and the power supply PS.

The lower substrate 111 and the upper substrate 112 which are flexible substrates can be configured by an insulating material which is bendable or extendable. For example, the lower substrate 111 and the upper substrate 112 can be formed of a silicon rubber such as polydimethylsiloxane (PDMS) or an elastomer such as polyurethane (PU) or polytetrafluoroethylene (PTFE). Accordingly, the lower substrate 111 and the upper substrate 112 can have flexibility. Depending on the example embodiment, the materials of the lower substrate 111 and the upper substrate 112 can be the same, but are not limited thereto and can vary.

The lower substrate 111 and the upper substrate 112 are ductile substrates to be reversibly expandable and contractible. Accordingly, the lower substrate 111 can be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 can be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, a modulus of elasticity of each of the lower substrate 111 and the upper substrate 112 can be several MPa to several hundreds of MPa. Further, a ductile breaking rate of each of the lower substrate 111 and the upper substrate 112 can be 100% or higher. Here, the ductile breaking rate refers to a stretching rate at a timing when an object to be stretched is broken or cracked. Further, a thickness of the lower substrate can be 10 um to 1 mm, but is not limited thereto.

The lower substrate 111 can include an active area AA and a non-active area NA which encloses the active area AA. However, the active area AA and the non-active area NA are not mentioned to be limited to the lower substrate 111, but mentioned for the entire display device 100.

The active area AA is an area in which images are displayed in the display device 100. A plurality of pixels PX can be disposed on the active area AA. Each pixel PX can include a display element and various driving elements for driving the display element. Various driving elements can refer to at least one thin film transistor (TFT) and a capacitor, but are not limited thereto. The plurality of pixels PX can be connected to various wiring lines, respectively. For example, each of the plurality of pixels PX can be connected to various wiring lines, such as a gate line, a data line, a high potential voltage line, a low potential voltage line, a reference voltage line, and an initialization voltage line.

The non-active area NA is an area where no image is displayed. The non-active area NA can be disposed to be adjacent to the active area AA. For example, the non-active area NA is an area which encloses the active area AA. However, it is not limited thereto so that the non-active area NA corresponds to an area excluding the active area AA from the lower substrate 111 and can be modified and separated in various forms. Components for driving a plurality of pixels PX disposed in the active area AA can be disposed on the non-active area NA. For example, the gate driver GD and the power supply PS can be disposed on the non-active area NA. Further, on the non-active area NA, a plurality of pads connected to the gate driver GD and the data driver DD can be disposed and each pad can be connected to each of the plurality of pixels PX of the active area AA.

A pattern layer 120 can be disposed on the lower substrate 111. According to one example embodiment, the pattern layer 120 can include a plurality of first plate patterns 121 and a plurality of first line patterns 122 disposed in the active area AA and a plurality of second plate patterns 123 and a plurality of second line patterns 124 disposed in the non-active area NA.

The plurality of first plate patterns 121 can be disposed in the active area AA of the lower substrate 111. A plurality of pixels PX can be formed on the plurality of first plate patterns 121. Further, the plurality of second plate patterns 123 can be disposed in the non-active area NA of the lower substrate 111. The gate driver GD and the power supply PS can be formed on the plurality of second plate patterns 123.

In one example embodiment, the plurality of first plate patterns 121 and the plurality of second plate patterns 123 can be formed in the shape of separate islands. The plurality of first plate patterns 121 and the plurality of second plate patterns 123 can be individually separated. Therefore, the plurality of first plate patterns 121 and the plurality of second plate patterns 123 can be referred to as first island patterns and second island patterns or first individual patterns and second individual patterns.

In one example embodiment, the gate driver GD can be mounted on the plurality of second plate patterns 123. The gate driver GD can be formed on the second plate pattern 123 in a gate in panel (GIP) manner when various elements on the first plate pattern 121 are manufactured. Therefore, various circuit configurations which configure the gate driver GD, such as various transistors, capacitors, and wiring lines, can be disposed on the plurality of second plate patterns 123. However, this is illustrative, so that the example embodiment of the present disclosure is not limited thereto and the gate driver GD can be mounted on the plurality of second plate patterns 123 in a chip on film (COF) manner.

In one example embodiment, the power supply PS can be mounted in the plurality of second plate patterns 123. The power supply PS is a plurality of power blocks patterned when various components on the first plate pattern 121 are manufactured and can be formed on the second plate pattern 123. Therefore, power blocks disposed on different layers can be disposed on the second plate pattern 123. For example, a lower power block and an upper power block can be sequentially disposed on the second plate pattern 123. For example, a low potential voltage can be applied to the lower power block and a high potential voltage can be applied to the upper power block. Accordingly, a low potential voltage can be supplied to the plurality of pixels PX through a lower power block and a high potential voltage can be supplied to the plurality of pixels through an upper power block.

According to the example embodiment, as illustrated in FIG. 1, sizes of the plurality of second plate patterns 123 can be larger than sizes of the plurality of first plate patterns 121. To be more specific, a size of each of the plurality of second plate patterns 123 can be larger than a size of each of the plurality of first plate patterns 121. As described above, the gate driver GD is disposed on each of the plurality of second plate patterns 123 and one stage of the gate driver GD can be disposed in each of the plurality of second plate patterns 123. Here, an area occupied by various circuit configurations which configure one stage of the gate driver GD can be relatively larger than an area occupied by the pixel PX so that a size of each of the plurality of second plate patterns 123 can be larger than a size of each of the plurality of first plate patterns 121.

Even though in FIG. 1, it is illustrated that the plurality of second plate patterns 123 are disposed on both sides of the non-active area NA in the second direction Y, this is illustrative, but the example embodiment of the present disclosure is not limited thereto. For example, the plurality of second plate patterns 123 can be disposed in an arbitrary area of the non-active area NA. Further, even though in FIG. 1, it is illustrated that the plurality of first plate patterns 121 and the plurality of second plate patterns 123 have a square shape, it is illustrative and the example embodiment of the present disclosure is not limited thereto and the shapes of the plurality of first plate patterns 121 and the plurality of second plate patterns 123 can vary in various forms.

Referring to FIGS. 1 and 3, the pattern layer 120 can further include a plurality of first line patterns 122 disposed in the active area AA and a plurality of second line patterns 124 disposed in the non-active area NA.

The plurality of first line patterns 122 are patterns which are disposed in the active area AA and connect the first plate patterns 121 which are adjacent to each other and can be referred to as first connection patterns. For example, the plurality of first line patterns 122 can be disposed between the plurality of first plate patterns 121.

The plurality of second line patterns 124 can be patterns which are disposed in the non-active area NA and connect the first plate patterns 121 and the second plate patterns 123 which are adjacent to each other or connect a plurality of second plate patterns 123 which is adjacent to each other. Accordingly, the plurality of second line patterns 124 can be referred to as second connection patterns. The plurality of second line patterns 124 can be disposed between the first plate pattern 121 and the second plate pattern 123 which are adjacent to each other. Further, the plurality of second line patterns 124 can be disposed between the plurality of adjacent second plate patterns 123.

In one example embodiment, referring to FIG. 1, the plurality of first line patterns 122 and second line patterns 124 can have a wavy shape or a curvy shape. For example, the plurality of first line patterns 122 and second line patterns 124 can have a sinusoidal shape or a coiled shape. However, this is just illustrative and the shapes of the plurality of first line patterns 122 and second line patterns 124 are not limited thereto. For example, the plurality of first line patterns 122 and second line patterns 124 can have a zigzag shape. As another example, the plurality of first line patterns 122 and second line patterns 124 can have various shapes such as a plurality of rhombic substrates which is connected at their vertexes to be extended. As described above, the number and the shape of the plurality of first line patterns 122 and second line patterns 124 illustrated in FIG. 1 are examples and can be changed in various forms depending on the design.

In one example embodiment, the plurality of first plate patterns 121, the plurality of first line patterns 122, the plurality of second plate patterns 123, and the plurality of second line patterns 124 can be rigid patterns. For example, the plurality of first plate patterns 121, the plurality of first line patterns 122, the plurality of second plate patterns 123, and the plurality of second line patterns 124 can be more rigid than the lower substrate 111 and the upper substrate 112. Accordingly, moduli of elasticity of the plurality of first plate patterns 121, the plurality of first line patterns 122, the plurality of second plate patterns 123, and the plurality of second line patterns 124 can be higher than a modulus of elasticity of the lower substrate 111. The modulus of elasticity is a parameter representing a rate of deformation against the stress applied to the substrate and the higher the modulus of elasticity, the higher the hardness. Therefore, the plurality of first plate patterns 121, the plurality of first line patterns 122, the plurality of second plate patterns 123, and the plurality of second line patterns 124 can be referred to as a plurality of first rigid patterns, a plurality of second rigid patterns, a plurality of third rigid patterns, and a plurality of fourth rigid patterns, respectively. Moduli of elasticity of the plurality of first plate patterns 121, the plurality of first line patterns 122, the plurality of second plate patterns 123, and the plurality of second line patterns 124 can be 1000 times higher than the moduli of elasticity of the lower substrate 111 and the upper substrate 112. However, this is illustrative and the example embodiment of the present disclosure is not limited thereto.

In one example embodiment, the plurality of first plate patterns 121, the plurality of first line patterns 122, the plurality of second plate patterns 123, and the plurality of second line patterns 124 can include a plastic material having a lower flexibility than the lower substrate 111 and the upper substrate 112. For example, the plurality of first plate patterns 121, the plurality of first line patterns 122, the plurality of second plate patterns 123, and the plurality of second line patterns 124 can include at least one material of polyimide (PI), polyacrylate, and polyacetate. According to an example embodiment, the plurality of first plate patterns 121, the plurality of first line patterns 122, the plurality of second plate patterns 123, and the plurality of second line patterns 124 can be formed of the same material, but is not limited thereto and can be formed of different materials. When the plurality of first plate patterns 121, the plurality of first line patterns 122, the plurality of second plate patterns 123, and the plurality of second line patterns 124 are formed of the same material, the plurality of first plate patterns 121, the plurality of first line patterns 122, the plurality of second plate patterns 123, and the plurality of second line patterns 124 can be integrally formed.

In some example embodiments, the lower substrate 111 can be defined to include a plurality of first lower patterns and a second lower pattern. The plurality of first lower patterns can be an area overlapping with the plurality of the first plate patterns 121 and the plurality of second plate patterns 123 of the lower substrate 111, but the second lower pattern can be an area which does not overlap with the plurality of the first plate patterns 121 and the plurality of second plate patterns 123.

Further, the upper substrate 112 can be defined to include a plurality of first upper patterns and a second upper pattern. The plurality of first upper patterns can be an area overlapping with the plurality of the first plate patterns 121 and the plurality of second plate patterns 123 of the upper substrate 112, but the second upper pattern can be an area which does not overlap with the plurality of the first plate patterns 121 and the plurality of second plate patterns 123.

At this time, moduli of elasticity of the plurality of first lower patterns and the first upper pattern can be higher than moduli of elasticity of the second lower pattern and the second upper pattern. For example, the plurality of first lower patterns and the first upper pattern can be formed of the same material as the plurality of first plate patterns 121 and the plurality of second plate patterns 123. The second lower pattern and the second upper pattern can be formed of a material having a modulus of elasticity lower than those of the plurality of first plate patterns 121 and the plurality of second plate patterns 123.

For example, the first lower pattern and the first upper pattern can be formed of polyimide (PI), polyacrylate, or polyacetate. Further, the second lower pattern and the second upper pattern can be formed of silicon rubber such as polydimethylsiloxane (PDMS) or elastomer such as polyurethane (PU) or polytetrafluoroethylene (PTFE).

Driving Element of Non-Active Area

The gate driver GD can supply a gate voltage to the plurality of pixels PX disposed in the active area AA. The gate driver GD includes a plurality of stages formed on the plurality of second plate patterns 123 and each stage included in the gate driver GD can be electrically connected to each other by means of the plurality of gate connection lines. Accordingly, a gate voltage output from any one of stages can be transmitted to the other stage. Each stage can sequentially supply the gate voltage to the plurality of pixels PX connected to each stage.

The power supply PS is connected to the gate driver GD to supply a gate driving voltage and a gate clock voltage to the gate driver GD. The power supply PS is connected to the plurality of pixels PX to supply a pixel driving voltage to each of the plurality of pixels PX. Further, the power supply PS can also be formed on the plurality of second plate patterns 123. For example, the power supply PS can be formed to be adjacent to the gate driver GD on the second plate pattern 123. A plurality of power supplies PS formed on the plurality of second plate patterns 123 can be electrically connected to the gate driver GD and the plurality of pixels PX. For example, the plurality of power supplies PS formed on the plurality of second plate patterns 123 can be connected by a gate power supply connection line and a pixel power supply connection line to be connected to the gate driver GD and the plurality of pixels PX. Therefore, each of the plurality of power supplies PS can supply a gate driving voltage, a gate clock voltage, and a pixel driving voltage.

The printed circuit board PCB can transmit signals and voltages for driving the display element from the control unit (e.g., controller) to the display element. Therefore, the printed circuit board PCB can also be referred to as a driving substrate. A control unit (e.g., controller), such as an IC chip or a circuit unit, can be mounted on the printed circuit board PCB. Further, on the printed circuit board PCB, a memory, a processor, or the like can also be mounted. The printed circuit board PCB provided in the display device 100 can include a stretching area and a non-stretching area to ensure stretchability. In the non-stretching area, an IC chip, a circuit unit, a memory, a processor, and the like can be also mounted and in the stretching area, wiring lines which are electrically connected to the IC chip, the circuit unit, the memory, and the processor can be disposed.

The data driver DD can supply a data voltage to the plurality of pixels PX disposed in the active area AA. The data driver DD can be configured as an IC chip so that it can be also referred to as a data integrated circuit D-IC. The data driver DD can be mounted in the non-stretching area of the printed circuit board PCB. For example, the data driver DD can be mounted on the printed circuit board PCB in the form of a chip on board (COB). Even though in FIG. 1, it is illustrated that the data driver DD is mounted in a chip on film (COF) manner, it is not limited thereto and the data driver DD can be mounted by a chip on board (COB), a chip on glass (COG), or a tape carrier package (TCP) manner.

Further, even though in FIG. 1, one data driver DD is disposed to correspond to one line of the first plate patterns 121 disposed in the active area AA, it is not limited thereto. For example, one data driver DD can be disposed to correspond to a plurality of lines of first plate patterns 121.

Hereinafter, the active area AA of the display device 100 according to the example embodiment of the present disclosure will be described in more detail with reference to FIGS. 4 and 5 together.

Planar and Cross-Sectional Structures of Active Area

Figure 4:
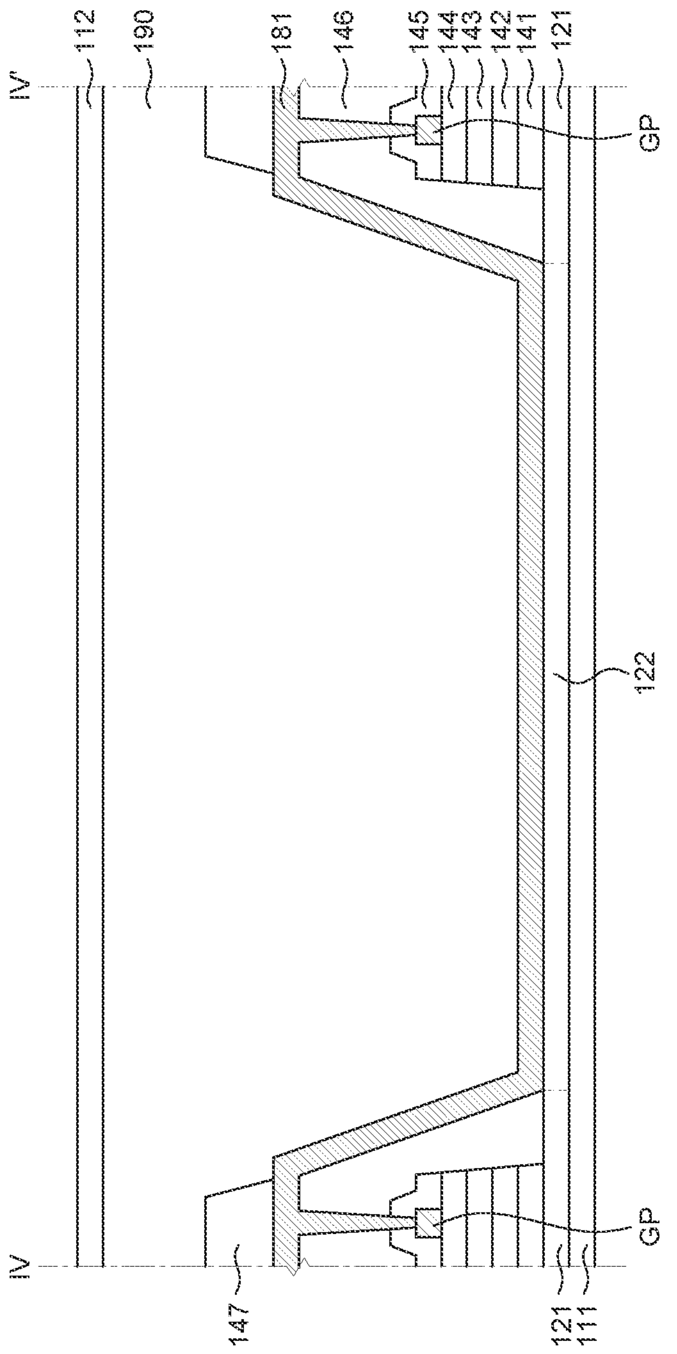
FIG. 4 is a cross-sectional view taken along the line IV-IV' of FIG. 2 according to an example embodiment of the present disclosure.

FIG. 4 is a cross-sectional view taken along the line IV-IV' of FIG. 2 according to an example embodiment of the present disclosure.

Figure 5:
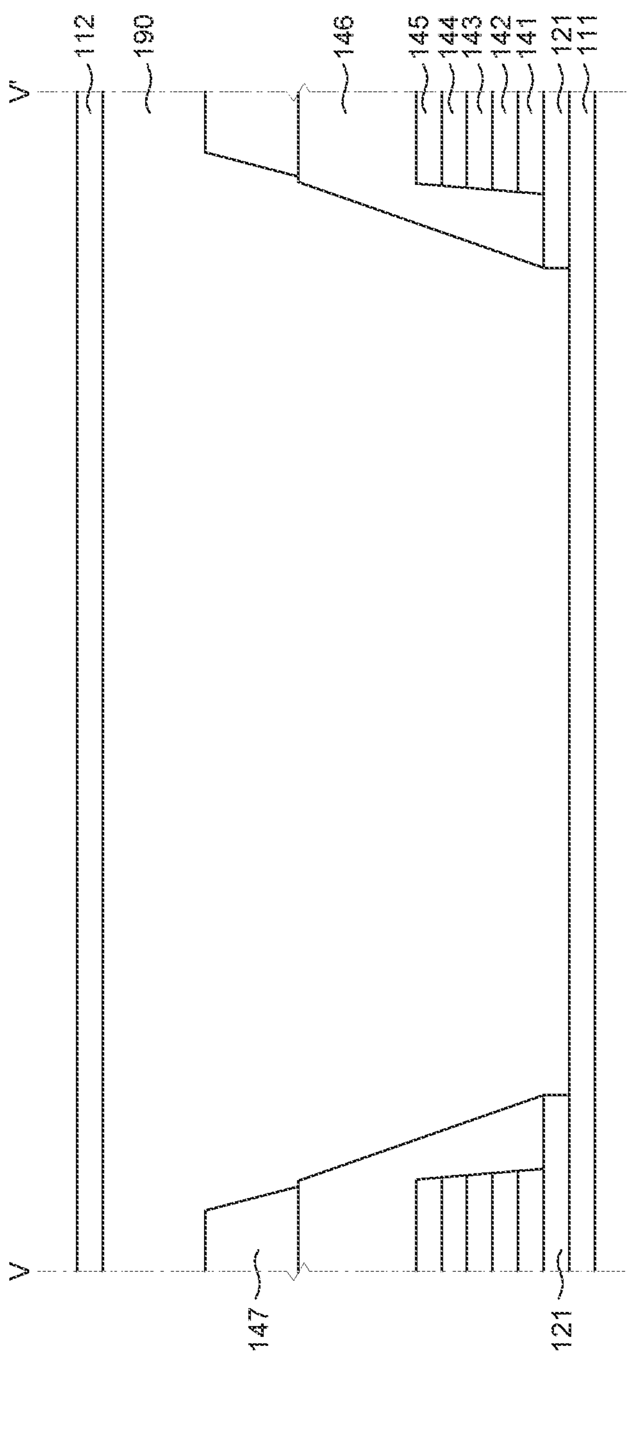
FIG. 5 is a cross-sectional view taken along the line V-V' of FIG. 2 according to an example embodiment of the present disclosure.

FIG. 5 is a cross-sectional view taken along the line V-V' of FIG. 2 according to an example embodiment of the present disclosure.

For the convenience of description, the description will be made with reference to FIGS. 1 to 3 together.

Referring to FIGS. 1 and 2, the plurality of first plate patterns 121 can be disposed on the lower substrate 111 in the active area AA. The plurality of first plate patterns 121 are spaced apart from each other to be disposed on the lower substrate 111. For example, as illustrated in FIG. 1, the plurality of first plate patterns 121 can be disposed on the lower substrate 111 in a matrix or a grid arrangement, but is not limited thereto.

Referring to FIGS. 2 and 3, a pixel PX including the plurality of sub pixels SPX can be disposed in the first plate pattern 121. Each of the plurality of sub pixels SPX can include an LED 170 which is a display element and a driving transistor 160 and a switching transistor 150 which drive the LED 170. For example, LED 170 can be a micro LED or a nano LED. However, in the sub pixel SPX, the display element is not limited to an LED, and can also be changed to an organic light emitting diode (e.g., an OLED). Further, the plurality of sub pixels SPX can include a red sub pixel, a green sub pixel, and a blue sub pixel, but is not limited thereto and colors of the plurality of sub pixels SPX can be modified to various colors as needed. For example, a white sub pixel can also be included.

The plurality of sub pixels SPX can be connected to a plurality of connection lines 181 and 182. For example, the plurality of sub pixels SPX can be electrically connected to the first connection line 181 extending in the first direction X and the plurality of sub pixels SPX can be electrically connected to the second connection line 182 extending in the second direction Y.

Hereinafter, a cross-sectional structure of the active area AA will be described in more detail with reference to FIG. 3.

Referring to FIG. 3, a plurality of inorganic insulating layers can be disposed on the plurality of first plate patterns 121. For example, a plurality of inorganic insulating layers can include a buffer layer 141, a gate insulating layer 142, a first interlayer insulating layer 143, a second interlayer insulating layer 144, and a passivation layer 145. However, the example embodiment of the present disclosure is not limited thereto and various inorganic insulating layers can be additionally disposed on the plurality of first plate patterns 121. At least one of the buffer layer 141, the gate insulating layer 142, the first interlayer insulating layer 143, the second interlayer insulating layer 144, and the passivation layer 145, which are inorganic insulating layers, can be omitted.

To be more specific, the buffer layer 141 can be disposed on the plurality of first plate patterns 121. The buffer layer 141 can be formed on the plurality of first plate patterns 121 to protect various components of the display device 100 from permeation of moisture ($H_2O$) and oxygen ($O_2$) from the outside of the lower substrate 111 and the plurality of first plate patterns 121. The buffer layer 141 can be configured by an insulating material. For example, the buffer layer 141 can be configured by a single layer or a double layer formed of at least one of silicon nitride (SiNx), silicon oxide (SiOx), and silicon oxynitride (SiON). However, the buffer layer 141 can be omitted depending on a structure or a characteristic of the display device 100.

Here, the buffer layer 141 can be formed only in an area where the lower substrate 111 overlaps with the plurality of first plate patterns 121 and the plurality of second plate patterns 123. As described above, the buffer layer 141 can be formed of an inorganic material so that the buffer layer 141 can be easily cracked or damaged during a process of stretching the display device 100. Therefore, the buffer layer 141 is not formed in an area between the plurality of first plate patterns 121 and the plurality of second plate patterns 123. Instead, the buffer layer 141 is patterned to have a shape of the plurality of first plate patterns 121 and the plurality of second plate patterns 123 to be disposed only above the plurality of first plate patterns 121 and the plurality of second plate patterns 123. Therefore, in the display device 100 according to the example embodiment of the present disclosure, the buffer layer 141 is formed only in an area overlapping the plurality of first plate patterns 121 and the plurality of second plate patterns 123 which are rigid patterns. Therefore, even though the display device 100 is bent or extended to be deformed, the damage to various components of the display device 100 can be suppressed.

A switching transistor 150 including a gate electrode 151, an active layer 152, a source electrode 153, and a drain electrode 154 and a driving transistor 160 including a gate electrode 161, an active layer 162, a source electrode and a drain electrode 164 can be formed on the buffer layer 141.

First, the active layer 152 of the switching transistor 150 and the active layer 162 of the driving transistor 160 can be disposed on the buffer layer 141. For example, the active layer 152 of the switching transistor 150 and the active layer 162 of the driving transistor 160 can be formed of oxide semiconductors, respectively. Alternatively, the active layer 152 of the switching transistor 150 and the active layer 162 of the driving transistor 160 can be formed of amorphous silicon (a-Si), polycrystalline silicon (poly-Si), an organic semiconductor, or the like.

The gate insulating layer 142 can be disposed on the active layer 152 of the switching transistor 150 and the active layer 162 of the driving transistor 160. The gate insulating layer 142 can electrically insulate the gate electrode 151 of the switching transistor 150 from the active layer 152 of the switching transistor 150 and electrically insulate the gate electrode 161 of the driving transistor 160 from the active layer 162 of the driving transistor 160. The gate insulating layer 142 can include an insulating material. For example, the gate insulating layer 142 can be configured by a single layer of silicon nitride (SiNx) or silicon oxide (SiOx) which is an inorganic material or a multiple layer of silicon nitride (SiNx) or silicon oxide (SiOx), but it is not limited thereto.

The gate electrode 151 of the switching transistor 150 and the gate electrode 161 of the driving transistor 160 can be disposed on the gate insulating layer 142. The gate electrode 151 of the switching transistor 150 and the gate electrode 161 of the driving transistor 160 can be disposed on the gate insulating layer 142 to be spaced apart from each other. The gate electrode 151 of the switching transistor 150 can overlap the active layer 152 of the switching transistor 150 and the gate electrode 161 of the driving transistor 160 can overlap with the active layer 162 of the driving transistor 160.

Each of the gate electrode 151 of the switching transistor 150 and the gate electrode 161 of the driving transistor 160 can be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The first interlayer insulating layer 143 can be disposed on the gate electrode 151 of the switching transistor 150 and the gate electrode 161 of the driving transistor 160. The first interlayer insulating layer 143 can insulate the gate electrode 161 of the driving transistor 160 from an intermediate metal layer IM. The first interlayer insulating layer 143 can be formed of an inorganic material, similar to the buffer layer 141. For example, the first interlayer insulating layer 143 can be configured by a single layer of silicon nitride (SiNx) or silicon oxide (SiOx) which is an inorganic material or a multiple layer of silicon nitride (SiNx) or silicon oxide (SiOx), but it is not limited thereto.

The intermediate metal layer IM can be disposed on the first interlayer insulating layer 143. The intermediate metal layer IM can overlap with the gate electrode 161 of the driving transistor 160. Therefore, a capacitor (for example, a storage capacitor) can be formed in an overlapping area of the intermediate metal layer IM and the gate electrode 161 of the driving transistor 160. Specifically, the storage capacitor can be formed by the gate electrode 161 of the driving transistor 160, the first interlayer insulating layer 143, and the intermediate metal layer IM. However, the placement area of the intermediate metal layer IM is not limited thereto and the intermediate metal layer IM can overlap with the other electrode to form the storage capacitor in various forms.

The intermediate metal layer IM can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The second interlayer insulating layer 144 can be disposed on the intermediate metal layer IM. The second interlayer insulating layer 144 can insulate the gate electrode 151 of the switching transistor 150 from the source electrode 153 and the drain electrode 154 of the switching transistor 150. The second interlayer insulating layer 144 can insulate the intermediate metal layer IM from the source electrode and the drain electrode 164 of the driving transistor 160. The second interlayer insulating layer 144 can be formed of an inorganic material, similar to the buffer layer 141. For example, the first interlayer insulating layer 143 can be configured by a single layer of silicon nitride (SiNx) or silicon oxide (SiOx) which is an inorganic material or a multiple layer of silicon nitride (SiNx) or silicon oxide (SiOx), but it is not limited thereto.

The source electrode 153 and the drain electrode 154 of the switching transistor 150 can be disposed on the second interlayer insulating layer 144. The source electrode and the drain electrode 164 of the driving transistor 160 can be disposed on the second interlayer insulating layer 144. The source electrode 153 and the drain electrode 154 of the switching transistor 150 can be disposed on the same layer to be spaced apart from each other. Even though in FIG. 1, the source electrode of the driving transistor 160 is omitted, the source electrode of the driving transistor 160 can be also disposed to be spaced apart from the drain electrode 164 on the same layer. In the switching transistor 150, the source electrode 153 and the drain electrode 154 can be in contact with the active layer 152 to be electrically connected to the active layer 152. In the driving transistor 160, the source electrode and the drain electrode 164 can be in contact with the active layer 162 to be electrically connected to the active layer 162. The drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 can include any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

Further, in this specification, even though it is described that the driving transistor 160 has a coplanar structure, various transistors such as a staggered structure can also be used. Further, in this specification, the transistor can be formed not only to have a top gate structure, but also to have a bottom gate structure or a dual gate structure.

A gate pad GP and a data pad DP can be disposed on the second interlayer insulating layer 144.

Specifically, referring to FIG. 4, the gate pad GP can be a pad which transmits a gate voltage to the plurality of sub pixels SPX. The gate pad GP can be connected to the first connection line 181 through a contact hole. The gate voltage supplied from the first connection line 181 can be transmitted to the gate electrode 151 of the switching transistor 150 from the gate pad GP through a wiring line formed on the first plate pattern 121.

Referring to FIG. 3 again, the data pad DP can be a pad which transmits a data voltage to the plurality of sub pixels SPX. The data pad DP can be connected to the second connection line 182 through a contact hole. The data voltage supplied from the second connection line 182 can be transmitted to the source electrode 153 of the switching transistor 150 from the data pad DP through a wiring line formed on the first plate pattern 121.

The voltage pad VP can be a pad which transmits a low potential voltage to the plurality of sub pixels SPX. The voltage pad VP can be connected to the first connection line 181 through a contact hole. The low potential voltage supplied from the first connection line 181 can be transmitted to the n-electrode 174 of the LED 170 from the voltage pad VP through a wiring line formed on the first plate pattern 121.

The gate pad GP and the data pad DP can be formed of the same material as the source electrode 153 and the drain electrodes 154 and 164, but are not limited thereto.

The passivation layer 145 can be formed on the switching transistor 150 and the driving transistor 160. For example, the passivation layer 145 covers the switching transistor 150 and the driving transistor 160 to protect the switching transistor 150 and the driving transistor 160 from the permeation of moisture and oxygen. The passivation layer 145 can be formed of an inorganic material and configured by a single layer or a double layer, but is not limited thereto.

The gate insulating layer 142, the first interlayer insulating layer 143, the second interlayer insulating layer 144, and the passivation layer 145 are patterned to be formed only in an area overlapping with the plurality of first plate patterns 121. The gate insulating layer 142, the first interlayer insulating layer 143, the second interlayer insulating layer 144, and the passivation layer 145 can be also formed of the inorganic material, similar to the buffer layer 141. Therefore, the gate insulating layer 142, the first interlayer insulating layer 143, the second interlayer insulating layer 144, and the passivation layer 145 can also be easily cracked or damaged during the process of stretching the display device 100. Therefore, the gate insulating layer 142, the first interlayer insulating layer 143, the second interlayer insulating layer 144, and the passivation layer 145 are not formed in an area between the plurality of first plate patterns 121. However, the gate insulating layer 142, the first interlayer insulating layer 143, the second interlayer insulating layer 144, and the passivation layer 145 are patterned to have a shape of the plurality of first plate patterns 121 to be formed only above the plurality of first plate patterns 121. For example, the sub pixels can be disposed on a plurality of ridged island shaped structures formed of multiple layers, which can be spaced apart from each other in a grid arrangement in which the area between is more flexible. Thus, the island shaped structures can move closer or farther apart from each other without cracking or being damaged as the display device is bent and stretched (e.g., similar to ice cubes in a flexible ice cube tray).

The planarization layer 146 can be formed on the passivation layer 145. The planarization layer 146 can planarize upper portions of the switching transistor 150 and the driving transistor 160. The planarization layer 146 can be configured by a single layer or a plurality of layers and can be formed of an organic material. Therefore, the planarization layer 146 can also be referred to as an organic insulating layer. For example, the planarization layer 146 can be formed of an acrylic organic material, but is not limited thereto.

Referring to FIG. 3, the planarization layer 146 can be disposed to cover top surfaces and side surfaces of the buffer layer 141, the gate insulating layer 142, the first interlayer insulating layer 143, the second interlayer insulating layer 144, and the passivation layer 145 on the plurality of first plate patterns 121. Further, the planarization layer 146 can enclose the buffer layer 141, the gate insulating layer 142, the first interlayer insulating layer 143, the second interlayer insulating layer 144, and the passivation layer 145 together with the plurality of first plate patterns 121. To be more specific, the planarization layer 146 can be disposed to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of first plate patterns 121. Accordingly, the planarization layer 146 can supplement a step on side surfaces of the buffer layer 141, the gate insulating layer 142, the first interlayer insulating layer 143, the second interlayer insulating layer 144, and the passivation layer 145. Further, the planarization layer 146 can enhance an adhesive strength of the connection lines 181 and 182 disposed on a side surface of the planarization layer 146.

Referring to FIG. 3, an inclination angle of the side surface of the planarization layer 146 can be smaller than or less steep than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 can have a slope which is gentler than a slope formed by the side surface of the passivation layer 145, the side surface of the first interlayer insulating layer 143, the side surface of the second interlayer insulating layer 144, the side surface of the gate insulating layer 142, and the side surface of the buffer layer 141. Therefore, the connection lines 181 and 182 which are disposed to be in contact with the side surface of the planarization layer 146 are disposed with a gentle slope so that when the display device 100 is stretched, the stress generated in the connection lines 181 and 182 can be reduced. Further, the side surface of the planarization layer 146 has a relatively gentle slope so that a crack in the connection lines 181 and 182 or separation thereof from the side surface of the planarization layer 146 can be suppressed.

Referring to FIGS. 2 to 4, the connection lines 181 and 182 refer to wiring lines which electrically connect the pads on the plurality of first plate patterns 121 (e.g., similar to bridges between two islands). The connection lines 181 and 182 can be disposed on the plurality of first line patterns 122. The connection lines 181 and 182 can extend onto the plurality of first plate patterns 121 to be electrically connected to the gate pad GP and the data pad DP on the plurality of first plate patterns 121. Further, referring to FIG. 1, the first line pattern 122 is not disposed in an area where the connection lines 181 and 182 are not disposed, among areas between the plurality of first plate patterns 121.

The connection lines 181 and 182 can include a first connection line 181 and a second connection line 182. The first connection line 181 and the second connection line 182 can be disposed between the plurality of first plate patterns 121. Specifically, the first connection line 181 can refer to a wiring line extending in a first direction X between the plurality of first plate patterns 121, among the connection lines 181 and 182. The second connection line 182 can refer to a wiring line extending in a second direction Y between the plurality of first plate patterns 121, among the connection lines 181 and 182.

The connection lines 181 and 182 can be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

In a display panel of a general display device, various wiring lines, such as a plurality of gate lines and a plurality of data lines, extend between the plurality of sub pixels in a straight line and the plurality of sub pixels are connected to one signal line. Therefore, in the display panel of the general display device, various wiring lines, such as a gate line, a data line, a high potential voltage line, and a reference voltage line, can extend from one side to the other side of the display panel of the organic light emitting display device without being disconnected on the substrate.

In contrast, in the display device 100 according to the example embodiment of the present disclosure, various wiring lines, such as a gate line, a data line, a high potential voltage line, a reference voltage line, or an initialization voltage line having a straight line shape which are considered to be used for the display panel of the general display device, are disposed only on the plurality of first plate patterns 121 and the plurality of second plate patterns 123. For example, in the display device 100 according to the example embodiment of the present disclosure, a linear wiring line can be disposed only on the plurality of first plate patterns 121 and the plurality of second plate patterns 123.

In the display device 100 according to the example embodiment of the present disclosure, the pads on the two adjacent first plate patterns 121 can be connected by the connection lines 181 and 182. Accordingly, the connection lines 181 and 182 can electrically connect the gate pads GP or the data pads DP on two adjacent first plate patterns 121. Accordingly, the display device 100 according to the example embodiment of the present disclosure can include a plurality of connection lines 181 and 182 which electrically connects various wiring lines, such as a gate line, a data line, a high potential voltage line, and a reference voltage line, between the plurality of first plate patterns 121. For example, the gate line can be disposed on the plurality of first plate patterns 121 disposed to be adjacent to each other in the first direction X and the gate pad GP can be disposed on both ends of the gate line. In this situation, the plurality of gate pads GP on the plurality of first plate patterns 121 adjacent to each other in the first direction X can be connected to each other by the first connection line 181 which serves as a gate line. Therefore, the gate line disposed on the plurality of first plate patterns 121 and the first connection line 181 disposed on the first line pattern 122 can serve as one gate line. The above-described gate line can be referred to as a scan signal line. Further, wiring lines which extend in the first direction X, among all various wiring lines which can be included in the display device 100, such as an emission signal line, a low potential voltage line, and a high potential voltage line, can also be electrically connected by the first connection line 181, as described above.

Referring to FIGS. 2 to 4, the first connection lines 181 can connect the gate pads GP on two first plate patterns 121 which are disposed side by side, among the gate pads GP on the plurality of first plate patterns 121 disposed to be adjacent in the first direction X (e.g., similar to a bridge connecting two islands). The first connection line 181 can serve as a gate line, an emission signal line, a high potential voltage line, or a low potential voltage line, but is not limited thereto. The gate pads GP on the plurality of first plate patterns 121 disposed in the first direction X can be connected by the first connection line 181 serving as a gate line and transmit one gate voltage.

Referring to FIGS. 2 and 3, the second connection line 182 can connect the data pads DP on two first plate patterns 121 which are disposed side by side, among the data pads DP on the plurality of first plate patterns 121 disposed to be adjacent in the second direction Y (e.g., similar to a bridge connecting two islands). The second connection line 182 can serve as a data line, a high potential voltage line, a low potential voltage line, or a reference voltage line, but is not limited thereto. The internal line on the plurality of first plate patterns 121 disposed in the second direction Y can be connected by the plurality of second connection lines 182 serving as a data line and transmit one data voltage.

As illustrated in FIG. 4, the first connection line 181 can be disposed to be in contact with a top surface and a side surface of the planarization layer 146 disposed on the first plate pattern 121. The first connection line 181 can be formed to extend onto the top surface of the first line pattern 122. Further, the second connection line 182 can be disposed to be in contact with a top surface and a side surface of the planarization layer 146 disposed on the first plate pattern 121. The second connection line 182 can be formed to extend onto the top surface of the first line pattern 122.

However, as illustrated in FIG. 5, there is no need to dispose a rigid pattern in an area where the first connection line 181 and the second connection line 182 are not disposed. Therefore, the first line pattern 122 which is a rigid pattern is not disposed below the first connection line 181 and the second connection line 182 (e.g., only flexible material is in this area between adjacent first plate patterns 121).

In the meantime, referring to FIG. 3, a bank 147 can be formed on the connection pad CNT, the connection lines 181 and 182, and the planarization layer 146. The bank 147 is a component which divides adjacent sub pixels SPX. The bank 147 can be disposed to cover at least a part of the pad PD, the connection lines 181 and 182, and the planarization layer 146. The bank 147 can be formed of an insulating material. Further, the bank 147 can include a black material. The bank 147 includes the black material to block wiring lines which can be visible through the active area AA (e.g., the bank 147 can function as a black matrix). For example, the bank 147 can be formed of a carbon-based mixture and for example, include carbon black. However, it is not limited thereto and the bank 147 can be formed of a transparent insulating material. Even though in FIG. 1, it is illustrated that a height of the bank 147 is lower than a height of the LED 170, the present disclosure is not limited thereto and the height of the bank 147 can be equal to the height of the LED 170.

Referring to FIG. 3, the LED 170 can be disposed on the connection pad CNT and the first connection line 181. The LED 170 can include an n-type layer 171, an active layer 172, a p-type layer 173, an n electrode 174, and a p electrode 175. The LED 170 of the display device 100 according to the example embodiment of the present disclosure can have a flip-chip structure in which the n-electrode 174 and the p-electrode 175 are formed on a same surface.

The n-type layer 171 can be formed by injecting an n-type impurity into gallium nitride (GaN) having excellent crystallinity. The n-type layer 171 can be disposed on a separate base substrate which is formed of a material which is capable of emitting light.

The active layer 172 can be disposed on the n-type layer 171. The active layer 172 is a emission layer which emits light in the LED 170 and can be formed of a nitride semiconductor, for example, indium gallium nitride (InGaN). The p-type layer 173 can be disposed on the active layer 172. The p-type layer 173 can be formed by injecting a p-type impurity into gallium nitride (GaN).

The LED 170 according to the example embodiment of the present disclosure can be manufactured by sequentially laminating the n-type layer 171, the active layer 172, and the p-type layer 173, and then etching a predetermined part to form the n-electrode 174 and the p-electrode 175. In this situation, the predetermined part is a space for separating the n electrode 174 and the p electrode 175 from each other and the predetermined part can be etched to expose a part of the n-type layer 171. In other words, the surfaces of the LED 170 on which the n-electrode 174 and the p-electrode 175 are disposed are not flat surfaces, but can have different heights.

As described above, the n-electrode 174 is disposed in the etched area and can be formed of a conductive material. Further, the p-electrode 175 is disposed in an area which is not etched and can be also formed of a conductive material. For example, the n-electrode 174 can be disposed on the n-type layer 171 which is exposed by the etching process and the p-electrode 175 can be disposed on the p-type layer 173. The p-electrode 175 can be formed of the same material as the n-electrode 174.

An adhesive layer AD is disposed on top surfaces of the connection pad CNT and the first connection line 181 and between the connection pad CNT and the first connection line 181 so that the LED 170 can be adhered onto the connection pad CNT and the first connection line 181. At this time, the n-electrode 174 can be disposed on the first connection line 181 and the p-electrode 175 can be disposed on the connection pad CNT.

The adhesive layer AD can be a conductive adhesive layer in which conductive balls are dispersed in an insulating base member. Therefore, when heat or a pressure is applied to the adhesive layer AD, the conductive balls are electrically connected in a portion applied with the heat or pressure to have a conductive property and an area which is not pressurized can have an insulation property. For example, the n-electrode 174 can be electrically connected to the first connection line 181 by means of the adhesive layer AD and the p-electrode 175 can be electrically connected to the connection pad CNT by means of the adhesive layer AD. After applying the adhesive layer AD onto the top surface of the first connection line 181 and the connection pad CNT by an inkjet method, the LED 170 is transferred onto the adhesive layer AD and is pressurized and heated. By doing this, the connection pad CNT can be electrically connected to the p-electrode 175 and the first connection line 181 can be electrically connected to the n-electrode 174. However, the remaining part of the adhesive layer AD excluding a part of the adhesive layer AD disposed between the n-electrode 174 and the first connection pad 181 and a part of the adhesive layer AD disposed between the p-electrode 175 and the connection pad CNT can have an insulation property. In the meantime, the adhesive layer AD can be divided to be disposed on the connection pad CNT and the first connection line 181, respectively.

The connection pad CNT is electrically connected to the drain electrode 164 of the driving transistor 160 to be applied with a driving voltage from the driving transistor 160 to drive the LED 170. Even though in FIG. 3, it is illustrated that the connection pad CNT is not in direct contact with the drain electrode 164 of the driving transistor 160, but is in indirect contact therewith, the present disclosure is not limited thereto. Therefore, the connection pad CNT and the drain electrode 164 of the driving transistor 160 can be in direct contact with each other. Further, a low potential driving voltage can be applied to the first connection line 181 to drive the LED 170. Therefore, when the display device 100 is turned on, different voltage levels applied to each of the connection pad CNT and the first connection line 181 are transmitted to the n-electrode 174 and the p-electrode 175 so that the LED 170 can emit light.

The upper substrate 112 can support various components disposed below the upper substrate 112. Specifically, the upper substrate 112 is formed by coating a material which configures the upper substrate 112 on the lower substrate 111 and the first plate pattern 121 and then hardening the material to be disposed to be in contact with the lower substrate 111, the first plate pattern 121, and the connection lines 181 and 182.

The upper substrate 112 can be formed of the same material as the lower substrate 111. For example, the upper substrate 112 can be formed of a silicon rubber such as polydimethylsiloxane (PDMS) or an elastomer such as polyurethane (PU) or polytetrafluoroethylene (PTFE) and thus can have a flexible property. However, the material of the upper substrate 112 is not limited thereto.

In addition, a polarization layer can be disposed on the upper substrate 112. The polarization layer can perform a function which polarizes light incident from the outside of the display device 100 to reduce the external light reflection. Further, an optical film other than the polarization layer can be disposed on the upper substrate 112.

The filling layer 190 can be disposed on the entire surface of the lower substrate 111 to be filled between the components disposed on the upper substrate 112 and the lower substrate 111. The filling layer 190 can be configured by a curable adhesive. Specifically, the material which configures the filling layer 190 is coated on the entire surface of the lower substrate 111 and then is cured so that the filling layer 190 can be disposed between the components disposed on the upper substrate 112 and the lower substrate 111. For example, the filling layer 190 can be an optically clear adhesive (OCA) and can be configured by an acrylic adhesive, a silicon-based adhesive, a urethane-based adhesive, and the like.

Circuit Structure and Driving Method of Active Area

Figure 6:
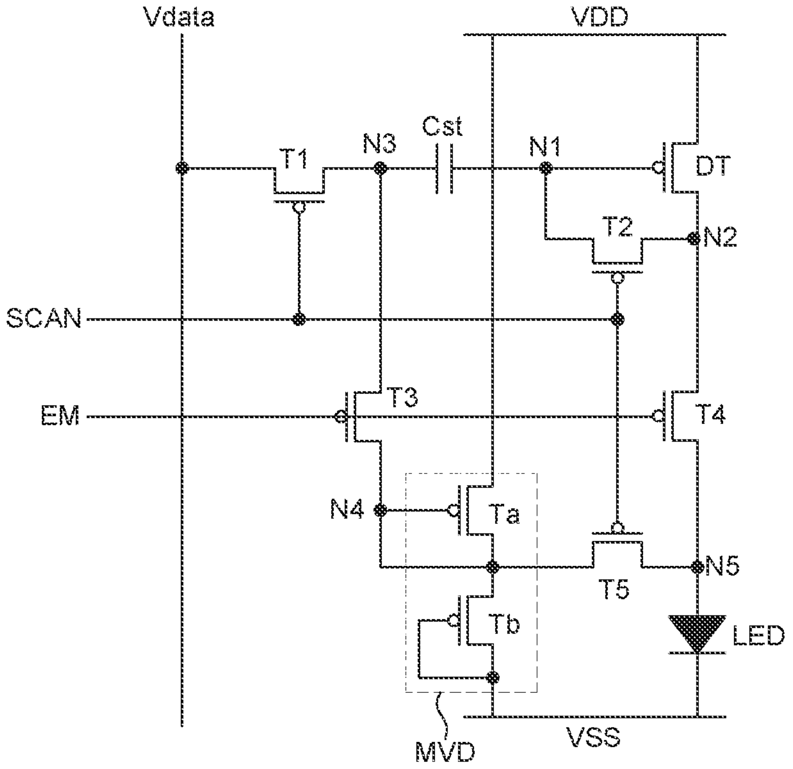
FIG. 6 is a circuit diagram of a pixel (sub pixel) according to an example embodiment of the present disclosure.

FIG. 6 is a circuit diagram of a pixel (sub pixel) according to an example embodiment of the present disclosure.

Figure 7:
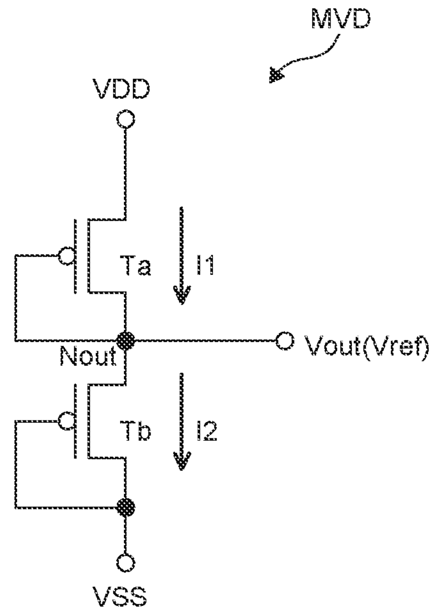
FIG. 7 is a circuit diagram illustrating an example of a voltage divider included in the pixel of FIG. 6 according to an example embodiment of the present disclosure.

FIG. 7 is a circuit diagram illustrating an example of a voltage divider included in the pixel of FIG. 6 according to an example embodiment of the present disclosure;

For the convenience of description, FIG. 6 illustrates a circuit diagram illustrating an example of one sub pixel SPX among a plurality of sub pixels SPX included in a pixel PX of the display device 100 according to the example embodiment of the present disclosure which has been described with reference to FIGS. 1 to 5.

The switching transistor 150 which has been described with reference to FIG. 3 can correspond to a first transistor T1 of FIG. 6 and the driving transistor 160 which has been described with reference to FIG. 3 can correspond to a driving transistor DT of FIG. 6. Further, the LED 170 which has been described with reference to FIG. 3 can correspond to the light emitting diode LED of FIG. 6.

Switching elements which configure each of the plurality of pixels (for example, one sub pixel) can be implemented by an n-type or a p-type MOSFET transistor. In the meantime, for the convenience of description, in the following example embodiment, even though a p-type transistor is illustrated, the example embodiment of the present disclosure is not limited. For example, at least some of switching elements which configure each of a plurality of pixels (for example, one sub pixel) can be modified to the n-type transistor.

Additionally, a transistor can be a three-electrode element including a gate electrode, a source electrode, and a drain electrode. The source electrode can be an electrode which supplies carriers to the transistor. In the transistor, the carriers start flowing from the source electrode. The drain electrode can be an electrode through which the carriers are output from the transistor to the outside. For example, the carriers in the MOSFET can flow from the source electrode to the drain electrode. In the situation of the n-type MOSFET (NMOS), since the carriers are electrons, in order to allow the electrons to flow from the source electrode to the drain electrode, a voltage of the source electrode is lower than a voltage of the drain electrode. In the n-type MOSFET, since the electrons flow from the source electrode to the drain electrode, the current can flow from the drain electrode to the source electrode. In the situation of the p-type MOSFET (PMOS), since the carriers are holes, in order to allow the holes to flow from the source electrode to the drain electrode, a voltage of the source electrode is higher than a voltage of the drain electrode. In the p-type MOSFET, since the holes flow from the source electrode to the drain electrode, the current can flow from the source electrode to the drain electrode. However, it should be noted that the source electrode and the drain electrode of the MOSFET are not fixed. For example, the source electrode and the drain electrode of the MOSFET can be changed depending on the applied voltage. For example, the example embodiment should not be limited by the source electrode and the drain electrode of the transistor to be mentioned in the following example embodiment.

Referring to FIG. 6, a pixel (for example, one sub pixel) according to the example embodiment of the present disclosure can include a light emitting diode LED, a driving transistor DT, first to fifth transistors T1 to T5, a storage capacitor Cst, and a voltage divider MVD.

A first electrode (for example, an anode electrode) of the light emitting diode LED can be connected to a fifth node N5 (or a fourth transistor T4 and a fifth transistor T5) and a second electrode (for example, a cathode electrode) can be connected to a low potential voltage line which supplies a low potential voltage VSS. The light emitting diode LED can generate light with a predetermined luminance (for example, emits light) in response to a current amount (or a driving current) supplied from the driving transistor DT.

In the meantime, for the convenience of description, even though in FIG. 6, it is illustrated that the pixel (for example, one sub pixel) according to the example embodiment of the present disclosure includes one light emitting diode LED, this is illustrative, but the example embodiment of the present disclosure is not limited thereto. For example, the pixel (for example, one sub pixel) according to the example embodiment of the present disclosure includes a plurality of light emitting diodes and the plurality of light emitting diodes can be connected in series, in parallel, or in series and parallel.

The first electrode (for example, a source electrode) of the driving transistor DT can be connected to a high potential voltage line which supplies a high potential voltage VDD and the second electrode (for example, a drain electrode) can be connected to a second node N2. Further, the gate electrode of the driving transistor DT can be connected to the first node N1. The driving transistor DT can control a driving current (for example, a current amount of a driving current) flowing to the low potential voltage line which supplies the low potential voltage VSS from the high potential voltage line which supplies the high potential voltage VDD via the light emitting diode LED, in response to its own gate-source voltage Vgs. To this end, the high potential voltage VDD can be set to be higher than the low potential voltage VSS. For example, the high potential voltage VDD can be a positive voltage (for example, approximately 12 V) and the low potential voltage VSS can be a ground voltage (for example, approximately 0 V). However, this is illustrative and the example embodiment of the present disclosure is not limited thereto and the low potential voltage VSS can be set to be a negative voltage.

The first transistor Ti can be connected between the data line which supplies a data voltage Vdata and the third node N3. For example, the first electrode (for example, a source electrode) of the first transistor Ti can be connected to a data line and the second electrode (for example, a drain electrode) can be connected to the third node N3. Further, the gate electrode of the first transistor Ti can be connected to the scan signal line which supplies a scan signal SCAN. The first transistor T1 is turned on when a turn-on level (for example, a low level) of scan signal SCAN is supplied to the scan signal line to electrically connect the data line and the third node N3. In this situation, the data voltage Vdata supplied from the data line can be applied to the third node N3 (for example, one electrode of the storage capacitor Cst).

The second transistor T2 can be connected between the gate electrode of the driving transistor DT and the second electrode (e.g., a drain electrode) (for example, between the first node N1 and the second node N2). For example, the first electrode (e.g., the source electrode) of the second transistor T2 can be connected to the second node N2 corresponding to the second electrode of the driving transistor DT. The second electrode (e.g., the drain electrode) can be connected to the first node N1 corresponding to the gate electrode of the driving transistor DT. Further, the gate electrode of the second transistor T2 can be connected to the scan signal line which supplies a scan signal SCAN. The second transistor T2 is turned on when a turn-on level (e.g., a low level) of scan signal SCAN is supplied to the scan signal line to electrically connect the first node N1 and the second node N2 (e.g., the gate electrode and the drain electrode of the driving transistor DT). For example, a timing when the gate electrode of the driving transistor DT and the second electrode (e.g., a drain electrode) is connected can be controlled by the scan signal SCAN. When the second transistor T2 is turned on, the driving transistor DT can be connected in a diode form (e.g., diode connecting).

The third transistor T3 can be connected to the third node N3 and the fourth node N4. For example, the first electrode (for example, a source electrode) of the third transistor T3 can be connected to the fourth node N4 and the second electrode (for example, a drain electrode) can be connected to the third node N3. Further, the gate electrode of the third transistor T3 can be connected to the emission signal line which supplies the emission signal EM. The third transistor T3 is turned on when a turn-on level (for example, a low level) of emission signal EM is supplied to the emission signal line to electrically connect the third node N3 and the fourth node N4. For example, the timing when the third node N3 and the fourth node N4 are connected can be controlled by the emission signal EM.

The fourth transistor T4 can be connected to the second node N2 and the fifth node N5. For example, the first electrode (e.g., the source electrode) of the fourth transistor T4 can be connected to the second node N2 (or the second electrode of the driving transistor DT). The second electrode (e.g., the drain electrode) can be connected to the fifth node N5 (or the first electrode of the light emitting diode LED). Further, the gate electrode of the fourth transistor T4 can be connected to the emission signal line which supplies the emission signal EM.

The fourth transistor T4 controls electrical connection between the driving transistor DT and the light emitting diode LED to form or block a current path. For example, the fourth transistor T4 is turned on when a turn-on level (e.g., a low level) of emission signal EM is supplied to the emission signal line to electrically connect the second node N2 and the fifth node N5. In this situation, the current path between the driving transistor DT and the light emitting diode LED can be formed. Further, the fourth transistor T4 can be turned off when the turn-off level (e.g., a high level) of emission signal EM is supplied to the emission signal line. In this situation, the current path between the driving transistor DT and the light emitting diode LED can be blocked.

The fifth transistor T5 can be connected between the fourth node N4 and the first electrode (or the fifth node N5) of the light emitting diode LED. For example, the first electrode (e.g., a source electrode) of the fifth transistor T5 can be connected to the fourth node N4 and the second electrode (e.g., a drain electrode) can be connected to the fifth node N5. Further, the gate electrode of the fifth transistor T5 can be connected to the scan signal line which supplies a scan signal SCAN. The fifth transistor T5 is turned on when a turn-on level (e.g., a low level) of scan signal SCAN is supplied to the scan signal line to electrically connect the fourth node N4 and the first electrode (or the fifth node N5) of the light emitting diode LED. For example, the timing when the fourth node N4 and the fifth node N5 are connected can be controlled by the scan signal SCAN.

The storage capacitor Cst can be connected between the gate electrode (or the first node N1) of the driving transistor DT and the third node N3. For example, the storage capacitor Cst can include a first electrode connected to the gate electrode of the driving transistor DT and the second electrode connected to the third node N3. Therefore, the storage capacitor Cst can store a voltage corresponding to a voltage difference between the first node N1 and the third node N3.

In the meantime, as described above, the gate electrode of the first transistor T1, the gate electrode of the second transistor T2, and the gate electrode of the fifth transistor T5 included in the pixel (e.g., one sub pixel) according to the example embodiment of the present disclosure can be commonly connected to one scan signal line. For example, in the display device (e.g., a display device 100 of FIG. 1) according to the example embodiment of the present disclosure, only one scan signal line is used to drive one pixel row (or a sub pixel row). Therefore, the aperture ratio of the display panel can be improved since the amount of wiring lines are reduced. Further, in the display device (e.g., a display device 100 of FIG. 1) according to the example embodiment of the present disclosure, the scan signal line is minimized to reduce the number of stretching lines so that the stretching rate and the stretching reliability can be improved. This will be described below in more detail with reference to FIG. 12.

Further, the gate electrode of the third transistor T3 and the gate electrode of the fourth transistor T4 included in the pixel (for example, one sub pixel) according to the example embodiment of the present disclosure can be commonly connected to one emission signal line. For example, in the display device (for example, a display device 100 of FIG. 1) according to the example embodiment of the present disclosure, only one emission signal line is used to drive one pixel row (or a sub pixel row). Therefore, the aperture ratio of the display panel can be improved since the number of wiring lines is reduced. Further, in the display device (e.g., a display device 100 of FIG. 1) according to the example embodiment of the present disclosure, the emission signal line is minimized to reduce the number of stretching lines so that the stretching rate and the stretching reliability can be improved. This will be described below in more detail with reference to FIG. 12.

The voltage divider MVD (e.g., a voltage division circuit) can be connected between the high potential voltage line which supplies a high potential voltage VDD and the low potential voltage line which supplies a low potential voltage VSS. Further, the voltage divider MVD can be connected to the fourth node N4.

In one example embodiment, the voltage divider MVD divides a voltage corresponding to a difference of the high potential voltage VDD and the low potential voltage VSS to generate a reference voltage (or an output voltage) and outputs the reference voltage to the fourth node N4.

The voltage divider MVD will be described in more detail with reference to FIG. 7. The voltage divider MVD can include a plurality of auxiliary transistors Ta and Tb which are connected in series between the high potential voltage line which supplies a high potential voltage VDD and the low potential voltage line which supplies a low potential voltage VSS.

In one example embodiment, the plurality of auxiliary transistors Ta and Tb included in the voltage divider MVD can be implemented as an MOSFET transistor (for example, n-type or p-type MOSFET transistor). For example, the voltage divider MVD according to the example embodiment of the present disclosure can be implemented as an MOSFET voltage divider. In the meantime, for the convenience of description, in FIG. 7, even though a p-type transistor is illustrated, the example embodiment of the present disclosure is not limited thereto. For example, at least some of the plurality of auxiliary transistors Ta and Tb included in the voltage divider MVD can be changed to an n-type transistor.

The voltage divider MVD can include a first auxiliary transistor Ta and a second auxiliary transistor Tb. The first auxiliary transistor Ta is connected between the high potential voltage line which supplies the high potential voltage VDD and an output node Nout and the second auxiliary transistor Tb is connected between the output node Nout and the low potential voltage line which supplies the low potential voltage VSS.

The first auxiliary transistor Ta can include a first electrode (for example, a source electrode) connected to the high potential voltage line which supplies the high potential voltage VDD, a second electrode (for example, a drain electrode) connected to the output node Nout, and a gate electrode connected to the output node Nout. For example, in the first auxiliary transistor Ta, the gate electrode and the second electrode (for example, the drain electrode) can be connected together. For example, the first auxiliary transistor Ta can be diode-connected.

The second auxiliary transistor Tb can include a first electrode (for example, the source electrode) connected to the output node Nout, a second electrode (for example, a drain electrode) connected to the low potential voltage line which supplies the low potential voltage VSS, and the gate electrode connected to the low potential voltage line. For example, in the second auxiliary transistor Tb, the gate electrode and the second electrode (for example, the drain electrode) can be connected together. For example, the second auxiliary transistor Tb can be diode-connected. Thus, the sub pixel circuit can include two diode-connected transistors connected in series.

As described above, each of the plurality of auxiliary transistors Ta and Tb which is included in the voltage divider MVD and is connected in series between the high potential voltage line and the low potential voltage line is diode-connected. Therefore, the current flows from the high potential voltage line which supplies the high potential voltage VDD to the low potential voltage line which supplies the low potential voltage VSS. At this time, each of the plurality of auxiliary transistors Ta and Tb included in the voltage divider MVD serves as resistors so that a voltage corresponding to the difference between the high potential voltage VDD and the low potential voltage VSS is divided to determine a voltage (or an output voltage Vout) of the output node Nout. For example, the output node Nout can have a voltage between the high potential voltage VDD and the low potential voltage VSS. For example, the output voltage Vout can have a voltage (e.g., approximately 2 V) between the high potential voltage VDD (e.g., approximately 12 V) and the low potential voltage VSS (e.g., approximately 0 V). However, this is just illustrative and the output voltage Vout can have various values.

An output voltage Vout output by the voltage divider MVD, for example, a voltage of the output node Nout will be described in more detail. A first current I1 which flows through the first auxiliary transistor Ta and a second current I2 which flows through the second auxiliary transistor Tb are determined, respectively, by the following Equations 1 and 2.

$$I1 = \frac{1}{2}k_1\left(\frac{W_1}{L_1}\right)(Vgs_1 - Vth_1)^2 \quad \text{[Equation 1]}$$

In Equation 1, $k_1$ is a proportional factor which is determined by an electron mobility of the first auxiliary transistor Ta and a parasitic capacitance. $W_1$ is a channel width of the first auxiliary transistor Ta, $L_1$ is a channel length of the first auxiliary transistor Ta, $V_{gs1}$ is a gate-source voltage of the first auxiliary transistor Ta and $Vth_1$ is a threshold voltage of the first auxiliary transistor Ta.

$$I2 = \frac{1}{2}k_2\left(\frac{W_2}{L_2}\right)(Vgs_2 - Vth_2)^2 \quad \text{[Equation 2]}$$

In Equation 2, $k_2$ is a proportional factor which is determined by an electron mobility of the second auxiliary transistor Tb and a parasitic capacitance. $W_2$ is a channel width of the second auxiliary transistor Tb, $L_2$ is a channel length of the second auxiliary transistor Tb, $V_{gs2}$ is a gate-source voltage of the second auxiliary transistor Tb and $Vth_2$ is a threshold voltage of the second auxiliary transistor Tb.

Here, the first current I1 flowing through the first auxiliary transistor Ta and the second current I2 flowing through the second auxiliary transistor Tb have the same value so that the value of the output voltage Vout can be determined by an equation (e.g., "I1=I2") using Equations 1 and 2.

To be more specific, the proportional factor $k_1$, the channel width $W_1$, the channel length $L_1$, and the threshold voltage $Vth_1$ of the first auxiliary transistor Ta and the proportional factor $k_2$, the channel width $W_2$, the channel length $L_2$, and the threshold voltage $Vth_2$ of the second auxiliary transistor Tb are values determined by the design of the auxiliary transistors Ta and Tb. Further, the gate-source voltage $V_{gs1}$ of the first auxiliary transistor Ta can correspond to a difference of the output voltage Vout and the high potential voltage VDD (e.g., "Vout-VDD") and the gate-source voltage $V_{gs2}$ of the second auxiliary transistor Tb can correspond to a difference of the low potential voltage VSS and the output voltage Vout (e.g., "VSS-Vout"). Therefore, the value of the output voltage Vout can be determined by the Equation (for example, "I1=I2").

As described above, the output voltage Vout generated by the voltage divider MVD can be used as a reference voltage Vref for driving (e.g., initialization) of a pixel (e.g., a sub pixel) according to the example embodiment of the present disclosure.

Referring to FIGS. 6 and 7, for example, the voltage divider MVD can divide a voltage corresponding to a difference of the high potential voltage VDD and the low potential voltage VSS to generate a reference voltage Vref (or an output voltage Vout) and output the reference voltage Vref to the fourth node N4. Here, the fourth node N4 can correspond to an output node Nout of the voltage divider MVD which has been described with reference to FIG. 7. As described above, the fourth node N4 can have a reference voltage Vref by the voltage divider MVD.

Here, as described above, the third transistor T3 can be turned on when the turn-on level (e.g., a low level) of emission signal EM is supplied to the emission signal line. In this situation, the reference voltage Vref of the fourth node N4 can be supplied to the second electrode (or the third node N3) of the storage capacitor Cst.

Further, as described above, the fifth transistor T5 is turned on when the turn-on level (e.g., a low level) of scan signal SCAN is supplied to the scan signal line. In this situation, the reference voltage Vref of the fourth node N4 can be supplied to the first electrode (or the fifth node N5) of the light emitting diode LED.

In the meantime, the value of the reference voltage Vref requested according to the design of the pixel (e.g., a sub pixel) according to the example embodiment of the present disclosure can vary. In order to allow the voltage divider MVD to output an output voltage Vout having a requested value of the reference voltage Vref (e.g., a specific, pre-defined value for Vref), characteristics of the auxiliary transistors Ta and Tb included in the voltage divider MVD can be adjusted and/or changed. For example, as described with reference to FIG. 7, values of currents (e.g., the first current I1 and the second current I2) flowing through the auxiliary transistors Ta and Tb included in the voltage divider MVD have the channel widths (e.g., $W_1$ and $W_2$) and/or the channel lengths (e.g., $L_1$ and $L_2$) of the auxiliary transistors Ta and Tb as parameters. Therefore, the channel widths (e.g., $W_1$ and $W_2$) and/or the channel lengths (e.g., $L_1$ and $L_2$) of the auxiliary transistors Ta and Tb are controlled or adjusted to control the voltage divider MVD to generate the output voltage Vout corresponding to the value of the reference voltage Vref requested by the design of the pixel (e.g., sub pixel) according to the example embodiment of the present disclosure.

In the meantime, even though in FIG. 7, an example embodiment in which the voltage divider MVD includes two auxiliary transistors Ta and Tb has been described, this is illustrative and the example embodiment of the present disclosure is not limited thereto. For example, the voltage divider MVD can include three or more auxiliary transistors to divide a voltage corresponding to the difference of the high potential voltage VDD and the low potential voltage VS S to generate a reference voltage Vref (or an output voltage Vout).

As described with reference to FIGS. 6 and 7, the desired reference voltage Vref to drive the pixel (e.g., one sub pixel) according to the example embodiment of the present disclosure can be generated by the voltage divider MVD included in the pixel (e.g., one sub pixel) without having a separate additional power source and an additional voltage line. For example, the display device (for example, the display device 100 of FIG. 1) according to the example embodiment of the present disclosure can generate the reference voltage Vref for driving the pixel by the voltage divider MVD without needing a separate additional voltage line. Therefore, the number of voltage lines to drive the pixel can be minimized. In other words, according to an embodiment, the sub pixel circuit can generate the reference voltage Vref internally, within itself, which eliminates the need for a separate wiring line extending to the sub pixel circuit to provide the reference voltage Vref. In this way, the number of separate wiring lines connected to a unit pixel (e.g., one island structure) can be even further reduced. Accordingly, the number of stretching lines is reduced to improve the stretching rate and the stretching reliability. In other words, since the number of wiring lines extending to one island structure (e.g., one pixel unit) is minimized, this reduces the risk of one of those wiring lines cracking or being damaged during stretching, since there is a smaller number of wiring lines. In this way, the lifespan of the stretchable display can be extended and the ability to stretch and flex can be improved. This will be described below in more detail with reference to FIG. 12.

Figure 8:
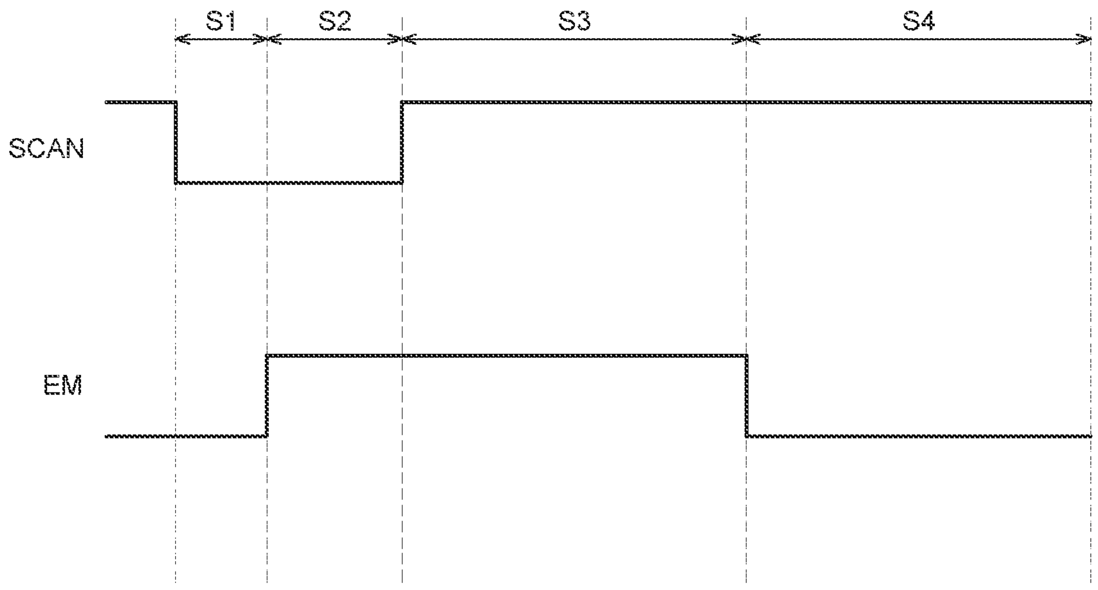
FIG. 8 is a waveform illustrating an example of signals supplied to the pixel of FIG. 6 according to an example embodiment of the present disclosure.

FIG. 8 is a waveform illustrating an example of signals supplied to the pixel of FIG. 6 according to an embodiment of the present disclosure.

Figure 9A:
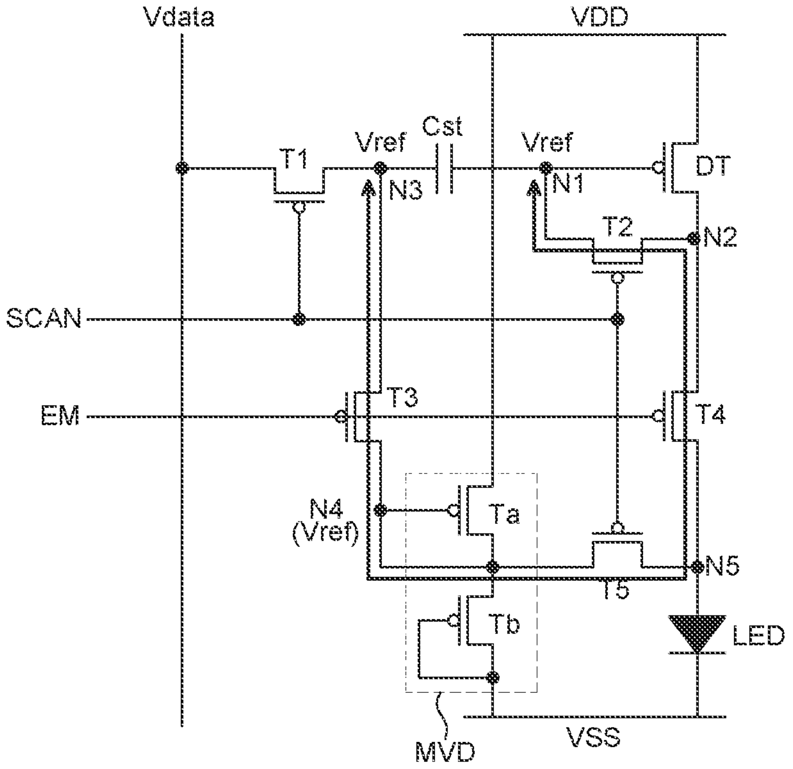
FIG. 9A is an equivalent circuit diagram illustrating an example of a state of the pixel of FIG. 6 during a first period according to an example embodiment of the present disclosure.

FIG. 9A is an equivalent circuit diagram illustrating an example of a state of the pixel of FIG. 6 during a first period (e.g., initial period) according to an embodiment of the present disclosure.

Figure 9B:
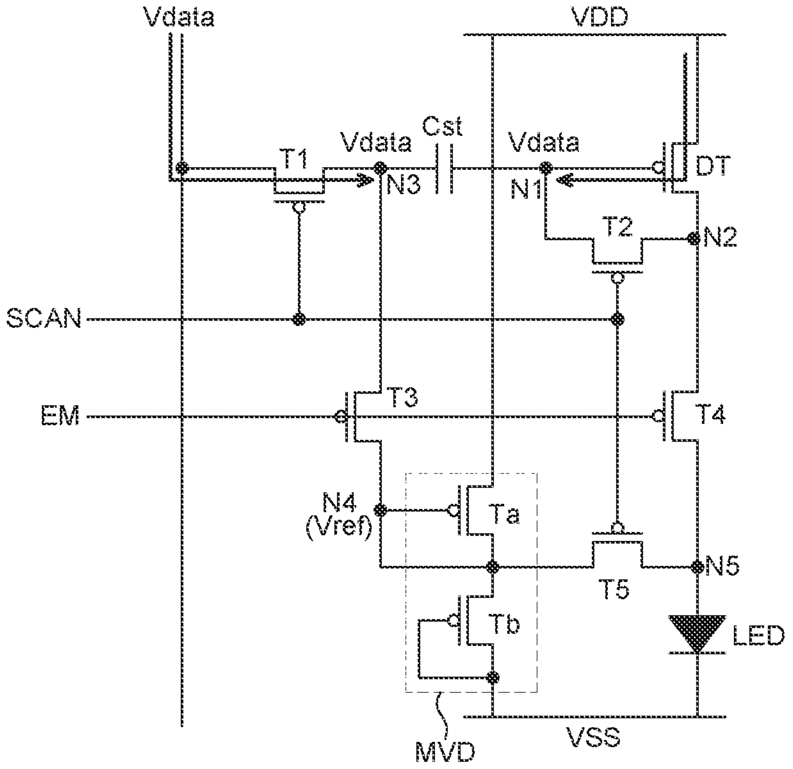
FIG. 9B is an equivalent circuit diagram illustrating an example of a state of the pixel of FIG. 6 during a second period according to an example embodiment of the present disclosure.

FIG. 9B is an equivalent circuit diagram illustrating an example of a state of the pixel of FIG. 6 during a second period (e.g., sampling period) according to an embodiment of the present disclosure.

Figure 9C:
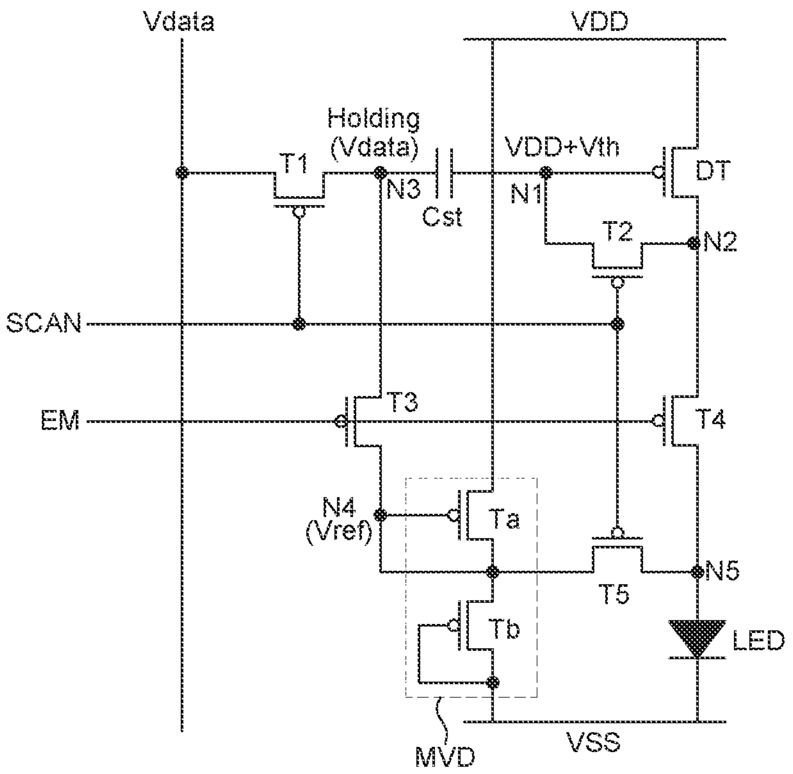
FIG. 9C is an equivalent circuit diagram illustrating an example of a state of the pixel of FIG. 6 during a third period according to an example embodiment of the present disclosure.

FIG. 9C is an equivalent circuit diagram illustrating an example of a state of the pixel of FIG. 6 during a third period (e.g., holding period) according to an embodiment of the present disclosure.

Figure 9D:
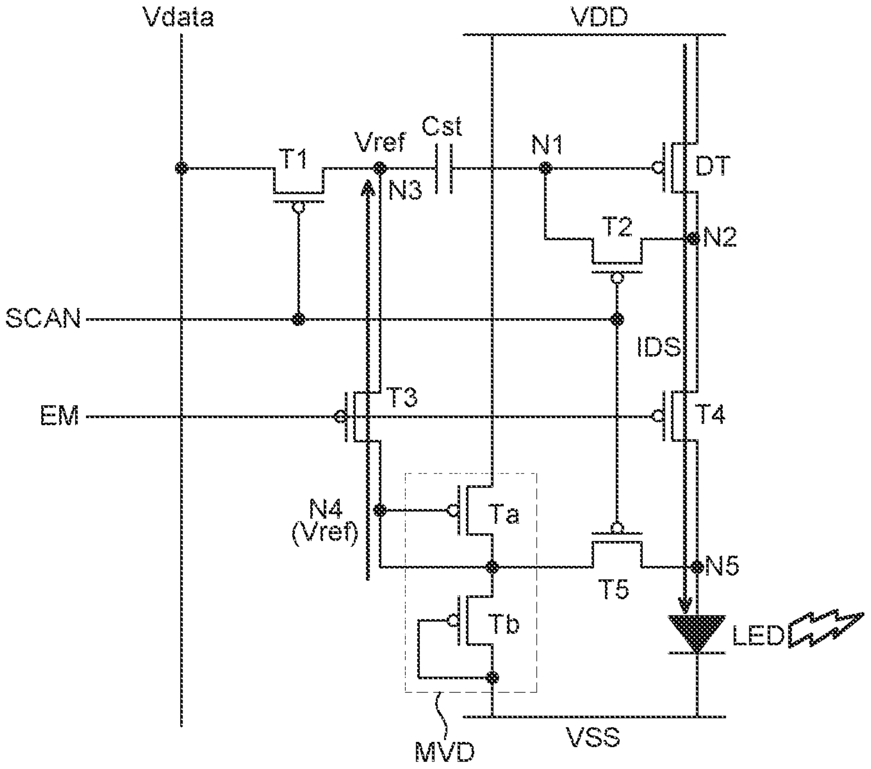
FIG. 9D is an equivalent circuit diagram illustrating an example of a state of the pixel of FIG. 6 during a fourth period according to an example embodiment of the present disclosure.

FIG. 9D is an equivalent circuit diagram illustrating an example of a state of the pixel of FIG. 6 during a fourth period (e.g., emission period) according to an embodiment of the present disclosure.

The driving of the display device (or a pixel) according to the example embodiment of the present disclosure will be described with reference to FIGS. 6, 8, 9A to 9D, as follows. In the meantime, according to the example embodiment, as described with reference to FIGS. 6 and 7, the fourth node N4 of the pixel can have a reference voltage Vref by the configuration or the operation of the voltage divider MVD (e.g., no separate wiring line is needed to externally provide the reference voltage Vref since it is generated internally within the sub pixel circuit).

First, referring to FIGS. 6, 8, and 9A, during the first period S1 (e.g., initial period), the scan signal SCAN which is supplied to the scan signal line can have a turn-on level (e.g., a low level). Therefore, the first transistor T1, the second transistor T2, and the fifth transistor T5 can be turned on or maintain a turned-on state. Further, during the first period Si, the emission signal EM which is supplied to the emission signal line can have a turn-on level (e.g., a low level). Therefore, the third transistor T3 and the fourth transistor T4 can be turned on or maintain a turned-on state.

In this situation, the reference voltage Vref of the fourth node N4 can be applied to the second electrode (or the third node N3) of the storage capacitor Cst by means of the turned-on third transistor T3. Further, the reference voltage Vref of the fourth node N4 can be applied to the second electrode (or the second node N2) of the driving transistor DT by means of the turned-on fourth transistor T4 and fifth transistor T5. Further, the reference voltage Vref can be applied to the gate electrode (or the first electrode of the storage capacitor Cst or the first node N1) of the driving transistor by means of the turned-on second transistor T2.

Therefore, both ends of the storage capacitor Cst or the gate electrode of the driving transistor DT can be initialized by the reference voltage Vref.

Next, referring to FIGS. 6, 8, and 9B, during the second period S2 (e.g., sampling period), the scan signal SCAN which is supplied to the scan signal line can have a turn-on level (e.g., a low level). Therefore, the first transistor T1, the second transistor T2, and the fifth transistor T5 can be turned on or maintain a turned-on state. Further, during the second period S2, the emission signal EM which is supplied to the emission signal line can have a turn-off level (e.g., a high level). Therefore, the third transistor T3 and the fourth transistor T4 can be turned off or maintain a turned-off state.

In this situation, the data voltage Vdata can be applied to the second electrode of the storage capacitor Cst, for example, the third node N3 by means of the turned-on first transistor T1.

Further, the second transistor T2 is also turned on so that the driving transistor DT forms a diode connection. Therefore, the gate electrode and the second electrode (e.g., the drain electrode) of the driving transistor DT are shorted or connected together so that the driving transistor DT can operate as a diode.

During the second period S2, a current flows between the source and drain of the driving transistor DT (e.g., between the first electrode and the second electrode of the driving transistor DT). At this time, since the gate electrode and the drain electrode of the driving transistor DT are diode-connected, a voltage of the gate electrode (or a voltage of the first node N1) of the driving transistor DT can gradually rise by a current flowing from the source electrode to the drain electrode of the driving transistor DT. For example, during the second period S2, the voltage of the first node N1 can be charged to a voltage (e.g., "VDD+Vth") corresponding to a sum of the high potential voltage VDD and the threshold voltage Vth of the driving transistor DT.

Next, referring to FIGS. 6, 8, and 9C, during the third period S3 (e.g., holding period), the scan signal SCAN which is supplied to the scan signal line can have a turn-off level (e.g., a high level). Therefore, the first transistor T1, the second transistor T2, and the fifth transistor T5 can be turned off or maintain a turned-off state. Further, during the third period S3, the emission signal EM which is supplied to the emission signal line can have a turn-off level (e.g., a high level). Therefore, the third transistor T3 and the fourth transistor T4 can be turned off or maintain a turned-off state.

In this situation, during the third period S3, the third node N3 can be electrically floated (or held). In the floated third node N3, the data voltage Vdata applied during the second period S2 can be substantially maintained. Further, as the voltage of the first node N1, a voltage charged during the second period S2 (e.g., a voltage corresponding to a sum of the high potential voltage VDD and the threshold voltage Vth of the driving transistor DT, for example, "VDD+Vth") can be substantially maintained.

Next, referring to FIGS. 6, 8, and 9D, during the fourth period S4 (or emission period), the scan signal SCAN which is supplied to the scan signal line can have a turn-off level (e.g., a high level). Therefore, the first transistor T1, the second transistor T2, and the fifth transistor T5 can be turned off or maintain a turned-off state. Further, during the fourth period S4, the emission signal EM which is supplied to the emission signal line can have a turn-on level (e.g., a low level). Therefore, the third transistor T3 and the fourth transistor T4 can be turned on or maintain a turned-on state.

In this situation, the third transistor T3 is turned on so that the reference voltage Vref can be applied to the third node N3. For example, the voltage of the third node N3 can be changed from a voltage in the third period S3 (e.g., the data voltage Vdata) to the reference voltage Vref. In response to the voltage variation of the third node N3, the voltage of the first node N1 can be also changed by the storage capacitor Cst.

Further, the fourth transistor T4 is turned on so that a current path of the driving current IDS which flows to the light emitting diode LED via the driving transistor DT can be formed. For example, the driving current IDS which passes through the source electrode and the drain electrode of the driving transistor DT is applied to the light emitting diode LED so that the light emitting diode LED can generate predetermined light corresponding to the current amount of the driving current IDS (e.g., emits light).

Another Example Embodiment of Present Disclosure

Figure 10:
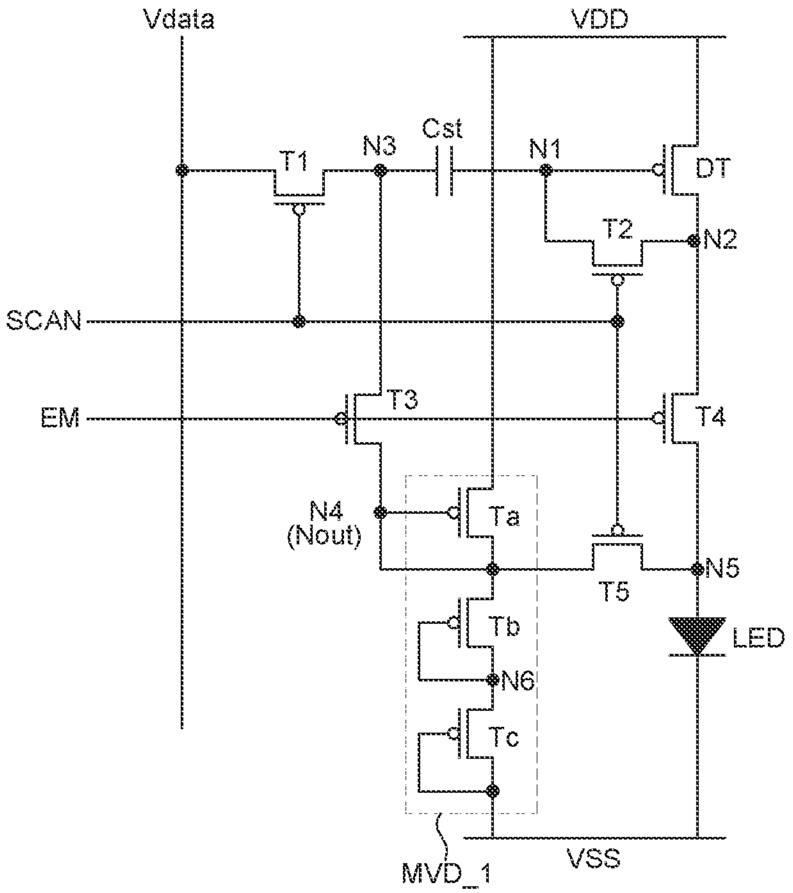
FIG. 10 is a circuit diagram of a pixel (sub pixel) according to an example embodiment of the present disclosure.

FIG. 10 is a circuit diagram of a pixel (sub pixel) according to an example embodiment of the present disclosure.

In FIG. 10, in order to avoid the redundant description, the difference from the above-described example embodiment will be mainly described and parts which will not be specifically described follow the above-described example embodiment. The same reference numeral denotes the same component and the similar reference numeral denotes similar component.

The pixel (sub pixel) according to the example embodiment of the present disclosure illustrated in FIG. 10 is a modified example embodiment of the pixel which has been described with reference to FIG. 6.

Referring to FIGS. 6 and 10, except for the configuration of the voltage divider MVD_1, the pixel (sub pixel) of FIG. 10 is substantially the same or similar to the pixel (sub pixel) described with reference to FIG. 6 so that a redundant description will not be repeated. For example, in FIG. 10, the voltage divider MVD_1 includes three transistors.

Referring to FIG. 10, a pixel (e.g., one sub pixel) according to the example embodiment of the present disclosure can include a light emitting diode LED, a driving transistor DT, first to fifth transistors Ti to T5, a storage capacitor Cst, and a voltage divider MVD_1.

The voltage divider MVD_1 (e.g., a voltage division circuit) can be connected between the high potential voltage line which supplies a high potential voltage VDD and the low potential voltage line which supplies a low potential voltage VSS and can be connected to the fourth node N4.

In the example embodiment, the voltage divider MVD_1 can include a plurality of auxiliary transistors Ta, Tb, and Tc which are connected in series between the high potential voltage line which supplies the high potential voltage VDD and the low potential voltage line which supplies the low potential voltage VSS. For example, the voltage divider MVD_1 can include a first auxiliary transistor Ta, a second auxiliary transistor Tb, and a third auxiliary transistor Tc. The first auxiliary transistor Ta is connected between the high potential voltage line which supplies the high potential voltage VDD and the fourth node N4 (e.g., the output node Nout of the voltage divider MVD_1). The second auxiliary transistor Tb is connected between the fourth node N4 and the sixth node N6 and the third auxiliary transistor Tc is connected between the sixth node N6 and the low potential voltage line which supplies the low potential voltage VSS.

For example, as described with reference to FIG. 6, the voltage divider MVD_1 can be configured to include three or more auxiliary transistors Ta, Tb, and Tc.

In the meantime, even though in FIG. 10, the output node Nout of the voltage divider MVD_1 is connected to the fourth node N4, this is just illustrative and the example embodiment of the present disclosure is not limited thereto. For example, the output node Nout of the voltage divider MVD_1 can be connected to the sixth node N6.

Still Another Example Embodiment of Present Disclosure

Figure 11:
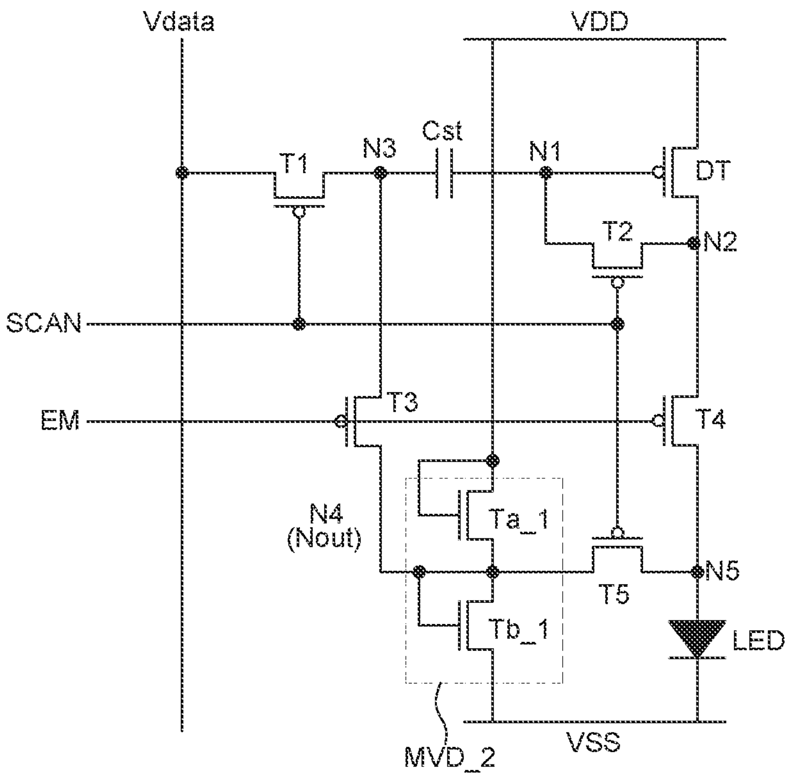
FIG. 11 is a circuit diagram of a pixel (sub pixel) according to an example embodiment of the present disclosure.

FIG. 11 is a circuit diagram of a pixel (sub pixel) according to an example embodiment of the present disclosure.

In FIG. 11, in order to avoid the redundant description, the difference from the above-described example embodiment will be mainly described and parts which will not be specifically described follow the above-described example embodiment. The same reference numeral denotes the same component and the similar reference numeral denotes similar component.

The pixel (sub pixel) according to the example embodiment of the present disclosure illustrated in FIG. 11 is a modified example embodiment of the pixel which has been described with reference to FIG. 6.

Referring to FIGS. 6 and 11, except for the configuration of the voltage divider MVD_2, the pixel (sub pixel) of FIG. 11 is substantially the same or similar to the pixel (sub pixel) described with reference to FIG. 6 so that a redundant description will not be repeated. For example, in FIG. 11, the transistors used for the voltage divider MVD_2 are n-type transistors.

Referring to FIG. 11, a pixel (e.g., one sub pixel) according to the example embodiment of the present disclosure can include a light emitting diode LED, a driving transistor DT, first to fifth transistors T1 to T5, a storage capacitor Cst, and a voltage divider MVD_2.

The voltage divider MVD_2 (e.g., a voltage division circuit) can be connected between the high potential voltage line which supplies a high potential voltage VDD and the low potential voltage line which supplies a low potential voltage VSS and can be connected to the fourth node N4.

In the example embodiment, the voltage divider MVD_2 can include a plurality of auxiliary transistors Ta_1 and Tb_1 which are connected in series between the high potential voltage line which supplies the high potential voltage VDD and the low potential voltage line which supplies the low potential voltage VSS. For example, the voltage divider MVD_2 can include a first auxiliary transistor Ta_1 and a second auxiliary transistor Tb_1. The first auxiliary transistor Ta_1 is connected between the high potential voltage line which supplies the high potential voltage VDD and the fourth node N4 (e.g., the output node Nout of the voltage divider MVD_2). The second auxiliary transistor Tb_1 is connected between the fourth node N4 and the low potential voltage line which supplies the low potential voltage VSS.

In one example embodiment, the voltage divider MVD_2 according to the example embodiment of the present disclosure can be implemented as an MOSFET voltage divider. For example, the plurality of auxiliary transistors Ta_1 and Tb_1 included in the voltage divider MVD_2 are MOSFET transistors and can be implemented as n-type MOSFET transistors.

The first auxiliary transistor Ta_1 can include a first electrode (e.g., a drain electrode) connected to the high potential voltage line which supplies the high potential voltage VDD, a second electrode (e.g., a source electrode) connected to the output node Nout, and a gate electrode connected to the output node Nout. For example, in the first auxiliary transistor Ta, the gate electrode and the first electrode (e.g., the drain electrode) are connected. For example, the first auxiliary transistor Ta_1 can be diode-connected.

The second auxiliary transistor Tb can include a first electrode (e.g., the drain electrode) connected to the output node Nout, a second electrode (e.g., a source electrode) connected to the low potential voltage line which supplies the low potential voltage VSS, and the gate electrode connected to the low potential voltage line. For example, in the second auxiliary transistor Tb_1, the gate electrode and the first electrode (e.g., the drain electrode) can be connected. For example, the second auxiliary transistor Tb_1 can be diode-connected.

As described with reference to FIG. 6, the auxiliary transistors Ta_1 and Tb_1 included in the voltage divider MVD_2 can be implemented as n-type transistors.

As described above, the pixel according to the example embodiments of the present disclosure and the display device including the same can minimize the number of scan signal lines, emission signal lines, and voltage lines. Accordingly, the number of stretching lines is reduced to improve the stretching rate and the stretching reliability. In other words, each pixel unit can be implemented in a rigid island type shape made of multiple layers with flexible material located between each of the island shapes, and since the number of wiring lines connected to each island is minimized, more space can be allocated to those wiring lines to allow for a wavy or coiled shape and the chances of one of those wiring lines being damaged or cracked during stretching and flexing can be reduced. This will be described in more detail with reference to FIG. 12.

Figure 12:
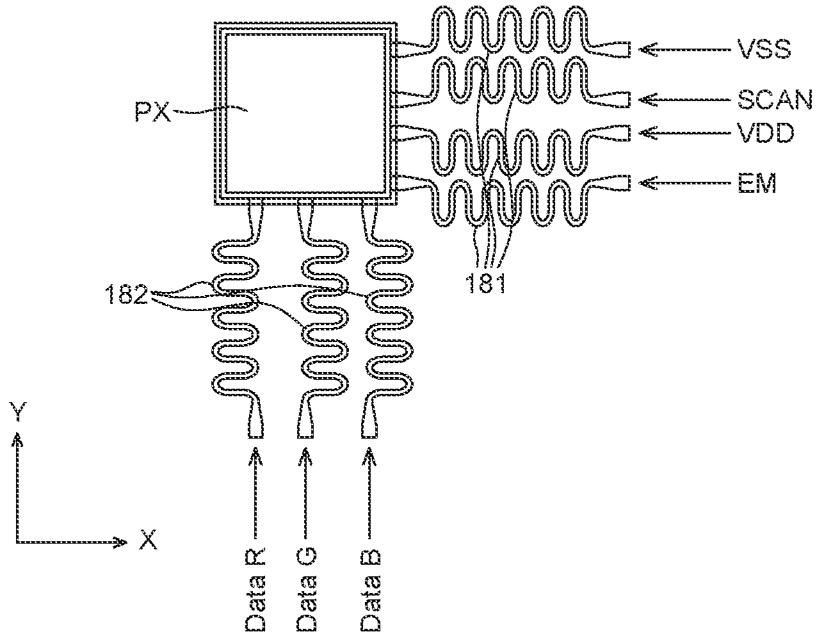
FIG. 12 is a view for explaining a connection relationship of a connection line included in a display device according to an example embodiment of the present disclosure.

FIG. 12 is a view for explaining a connection relationship of a connection line included in a display device according to an example embodiment of the present disclosure.

Referring to FIGS. 1 and 12, in the display device (e.g., the display device 100 of FIG. 1) according to the example embodiment of the present disclosure, four first connection lines 181 which are connected to one pixel PX can be used and three second connection lines 182 which are connected to one pixel PX can be used. In other words, one pixel unit including three sub pixels can be effectively driven and controlled by just seven wiring lines.

Specifically, four first connection lines 181 can be a scan signal line which transmits a scan signal SCAN, an emission signal line which transmits an emission signal EM, a low potential voltage line which transmits the low potential voltage VS S, and a high potential voltage line which transmits the high potential voltage VDD, respectively. Further, three second connection lines 182 can be a red data line which transmits a red data voltage Data R, a green data line which transmits a green data voltage Data G, and a blue data line which transmits a blue data voltage Data B.

In the display device according to the example embodiment of the present disclosure, as described with reference to FIG. 6, the number of first connection lines 181 extending in the first direction X (e.g., a scan signal line, an emission signal line, a low potential voltage line, and a high potential voltage line) can be minimized. For example, the scan signal line for transmitting the scan signal SCAN, among the first connection lines 181 is unified as one and the emission signal line for transmitting the emission signal EM is unified as one to reduce (e.g., minimize) the number of first connection lines 181.

Further, the number of the second connection line 182 (for example, data lines) extending in the second direction Y can be minimized. For example, without disposing a separate voltage line to supply a reference voltage required to drive the pixel PX, the display device according to the example embodiment of the present disclosure internally generates the reference voltage Vref used to drive the pixel PX using the voltage divider (e.g., a voltage divider MVD of FIG. 6) included in the pixel PX (e.g., the sub pixel). Therefore, the number of second connection lines 182 extending in the second direction Y can be reduced (e.g., minimized).

As described above, the pixel according to the example embodiment of the present disclosure and the display device including the same can reduce (e.g., minimize) the number of signal lines and the voltage lines. Accordingly, the number of stretching lines is reduced to improve the stretching rate and the stretching reliability.

The example embodiments of the present disclosure can also be described as follows below.

According to an aspect of the present disclosure, a pixel includes a light emitting diode; a driving transistor which includes a gate electrode connected to a first node, is connected between a high potential voltage line and a second node, configured to generate a driving current flowing from the high potential voltage line to a low potential voltage line by means of the light emitting diode; a storage capacitor connected between the first node and a third node; a first transistor which is connected between the third node and a data line and includes a gate electrode connected to a scan signal line; a second transistor which is connected between the first node and the second node and includes a gate electrode connected to the scan signal line; a third transistor which is connected between the third node and a fourth node and includes a gate electrode connected to emission signal line; and a voltage divider which is connected between the high potential voltage line and the low potential voltage line and divides a voltage corresponding to a difference between the high potential voltage supplied to the high potential voltage line and the low potential voltage supplied to the low potential voltage line to generate a reference voltage and outputs the reference voltage to the fourth node.

The voltage divider can include a plurality of auxiliary transistors which is connected between the high potential voltage line and the low potential voltage line in series.

The plurality of auxiliary transistors can be PMOS transistors.

The plurality of auxiliary transistors can include a first auxiliary transistor which is connected between the high potential voltage line and the fourth node and includes a gate electrode connected to the fourth node; and a second auxiliary transistor which is connected between the fourth node and the low potential voltage line and includes a gate electrode connected to the low potential voltage line.

The plurality of auxiliary transistors can be NMOS transistors.

The plurality of auxiliary transistors can include a first auxiliary transistor which is connected between the high potential voltage line and the fourth node and includes a gate electrode connected to the high potential voltage line; and a second auxiliary transistor which is connected between the fourth node and the low potential voltage line and includes a gate electrode connected to the fourth node.

A voltage of the fourth node can be maintained to the reference voltage.

The pixel can further comprise a fourth transistor which is connected between the second node and a fifth node corresponding to a first electrode of the light emitting diode and includes the gate electrode connected to the emission signal line; and a fifth transistor which is connected between the fourth node and the fifth node and includes the gate electrode connected to the scan signal line.

According to an aspect of the present disclosure, a display device includes a stretchable lower substrate; a pattern layer which is disposed on the lower substrate and includes a plurality of plate patterns and a plurality of line patterns; a plurality of pixels which is disposed above each of the plurality of plate patterns; and a plurality of connection lines which is disposed above each of the plurality of line patterns to connect the plurality of pixels. Each pixel circuit formed in the plurality of pixels can include a voltage divider connected between the high potential voltage line and the low potential voltage line.

Each of the pixel circuits formed in the plurality of pixels can include a light emitting diode; a driving transistor which includes a gate electrode connected to a first node, is connected between the high potential voltage line and a second node, configured to generate a driving current flowing from the high potential voltage line to the low potential voltage line by means of the light emitting diode; a storage capacitor connected between the first node and a third node; a first transistor which is connected between the third node and any one of a plurality of data lines and includes a gate electrode connected to a scan signal line; a second transistor which is connected between the first node and the second node and includes the gate electrode connected to the scan signal line; a third transistor which is connected between the third node and a fourth node and includes a gate electrode connected to an emission signal line; a fourth transistor which is connected between the second node and a fifth node corresponding to the first electrode of the light emitting diode and includes the gate electrode connected to the emission signal line; and a fifth transistor which is connected between the fourth node and the fifth node and includes the gate electrode connected to the scan signal line.

The voltage divider can divide a voltage corresponding to a difference of a high potential voltage which is supplied to the high potential voltage line and a low potential voltage which is supplied to the low potential voltage line to generate a reference voltage and outputs the reference voltage to the fourth node.

The voltage divider can include a plurality of auxiliary transistors which is connected between the high potential voltage line and the low potential voltage line in series.

The plurality of auxiliary transistors is PMOS transistors.

The plurality of auxiliary transistors can include a first auxiliary transistor which is connected between the high potential voltage line and the fourth node and includes a gate electrode connected to the fourth node; and a second auxiliary transistor which is connected between the fourth node and the low potential voltage line and includes a gate electrode connected to the low potential voltage line.

The plurality of auxiliary transistors is NMOS transistors.

The plurality of auxiliary transistors can include a first auxiliary transistor which is connected between the high potential voltage line and the fourth node and includes a gate electrode connected to the high potential voltage line; and a second auxiliary transistor which is connected between the fourth node and the low potential voltage line and includes a gate electrode connected to the fourth node.

A voltage of the fourth node is maintained to the reference voltage.

The plurality of connection lines can include a plurality of first connection lines extending in a first direction; and a plurality of second connection lines extending in a second direction.

The plurality of first connection lines can include the scan signal line, the emission signal line, the high potential voltage line, and the low potential voltage line and the plurality of second connection lines includes the plurality of data lines.

The number of the plurality of second connection lines can be smaller than the number of the plurality of first connection lines.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure.

What is claimed is:

1. A pixel, comprising:

a light emitting diode;

a driving transistor including a gate electrode connected to a first node that is connected between a high potential voltage line and a second node, the driving transistor being configured to generate a driving current flowing from the high potential voltage line to a low potential voltage line to drive the light emitting diode;

a storage capacitor connected between the first node and a third node;

a first transistor connected between the third node and a data line, the first transistor including a gate electrode connected to a scan signal line;

a second transistor connected between the first node and the second node, the second transistor including a gate electrode connected to the scan signal line;

a third transistor connected between the third node and a fourth node, the third transistor including a gate electrode connected to an emission signal line; and a voltage divider connected between the high potential voltage line and the low potential voltage line, the voltage divider being configured to divide a voltage corresponding to a difference between a high potential voltage supplied to the high potential voltage line and a low potential voltage supplied to the low potential voltage line to generate a reference voltage and output the reference voltage to the fourth node.

2. The pixel according to claim 1, wherein the voltage divider includes a plurality of auxiliary transistors connected in series between the high potential voltage line and the low potential voltage line.

3. The pixel according to claim 2, wherein the plurality of auxiliary transistors are p-type transistors.

4. The pixel according to claim 3, wherein the plurality of auxiliary transistors include:

a first auxiliary transistor connected between the high potential voltage line and the fourth node and including a gate electrode connected to the fourth node; and a second auxiliary transistor connected between the fourth node and the low potential voltage line and including a gate electrode connected to the low potential voltage line.

5. The pixel according to claim 2, wherein the plurality of auxiliary transistors are n-type transistors.

6. The pixel according to claim 5, wherein the plurality of auxiliary transistors include:

a first auxiliary transistor connected between the high potential voltage line and the fourth node and including a gate electrode connected to the high potential voltage line; and a second auxiliary transistor connected between the fourth node and the low potential voltage line and including a gate electrode connected to the fourth node.

7. The pixel according to claim 1, wherein a voltage of the fourth node is maintained at the reference voltage output by the voltage divider.

8. The pixel according to claim 1, further comprising:

a fourth transistor connected between the second node and a fifth node corresponding to a first electrode of the light emitting diode, the fourth transistor including a gate electrode connected to the emission signal line; and a fifth transistor connected between the fourth node and the fifth node, the fifth transistor including a gate electrode connected to the scan signal line.

9. A display device, comprising:

a stretchable lower substrate;

a pattern layer disposed on the lower substrate and including a plurality of plate patterns and a plurality of line patterns;

a plurality of pixels disposed on the plurality of plate patterns;

a plurality of connection lines disposed on the plurality of line patterns to connect the plurality of pixels; and pixel circuits formed in the plurality of pixels, each of the pixel circuits including a voltage divider connected between a high potential voltage line and a low potential voltage line, wherein the plurality of connection lines include a plurality of first connection lines extending in a first direction and a plurality of second connection lines extending in a second direction different than the first direction, and wherein a number of the plurality of second connection lines is less than a number of the plurality of first connection lines.

10. The display device according to claim 9, wherein each of the pixel circuits includes:

a light emitting diode;

a driving transistor including a gate electrode connected to a first node that is connected between the high potential voltage line and a second node, the driving transistor being configured to generate a driving current flowing from the high potential voltage line to the low potential voltage line to drive the light emitting diode;

a storage capacitor connected between the first node and a third node;

a first transistor connected between the third node and one of a plurality of data lines, the first transistor including a gate electrode connected to a scan signal line;

a second transistor connected between the first node and the second node, the second transistor including a gate electrode connected to the scan signal line;

a third transistor connected between the third node and a fourth node, the third transistor including a gate electrode connected to an emission signal line;

a fourth transistor connected between the second node and a fifth node corresponding to a first electrode of the light emitting diode, the fourth transistor including a gate electrode connected to the emission signal line; and a fifth transistor connected between the fourth node and the fifth node, the fifth transistor including a gate electrode connected to the scan signal line.

11. The display device according to claim 10, wherein the voltage divider is configured to divide a voltage corresponding to a difference of a high potential voltage supplied to the high potential voltage line and a low potential voltage supplied to the low potential voltage line to generate a reference voltage and output the reference voltage to the fourth node.

12. The display device according to claim 11, wherein a voltage of the fourth node is maintained at the reference voltage output by the voltage divider.

13. The display device according to claim 10, wherein the voltage divider includes a plurality of auxiliary transistors connected in series between the high potential voltage line and the low potential voltage line.

14. The display device according to claim 13, wherein the plurality of auxiliary transistors are p-type transistors.

15. The display device according to claim 14, wherein the plurality of auxiliary transistors include:

a first auxiliary transistor connected between the high potential voltage line and the fourth node and including a gate electrode connected to the fourth node; and a second auxiliary transistor connected between the fourth node and the low potential voltage line and including a gate electrode connected to the low potential voltage line.

16. The display device according to claim 13, wherein the plurality of auxiliary transistors are n-type transistors.

17. The display device according to claim 16, wherein the plurality of auxiliary transistors include:

a first auxiliary transistor connected between the high potential voltage line and the fourth node and including a gate electrode connected to the high potential voltage line; and a second auxiliary transistor connected between the fourth node and the low potential voltage line and including a gate electrode connected to the fourth node.

18. The display device according to claim 10, wherein the plurality of first connection lines include the scan signal line, the emission signal line, the high potential voltage line, and the low potential voltage line and wherein the plurality of second connection lines include the plurality of data lines.

19. A display device, comprising:

a flexible substrate;

a plurality of island shaped structures disposed on the flexible substrate, each of the plurality of island shaped structures being spaced apart from each other and including a stack of multiple layers; and a plurality of pixels disposed on or in the plurality of island shaped structures, wherein each pixel among the plurality of pixels includes sub pixels, and each of the sub pixels includes a voltage divider configured to internally generate a reference voltage for the corresponding sub pixel, and wherein the voltage divider in each of the sub pixels includes two transistors connected in series.

20. The display device according to claim 19, wherein one row of pixels included in the plurality of island shaped structures are commonly connected to a same scan signal line.

21. The display device according to claim 19, wherein one row of pixels included in the plurality of island shaped structures are commonly connected to a same emission signal line.

22. The display device according to claim 19, further comprising:

a plurality of first connection lines extending in a first direction and being connected between a first pair of adjacent island shaped structures among the plurality of island shaped structures; and a plurality of second connection lines extending in a second direction and being connected between a second pair of adjacent island shaped structures among the plurality of island shaped structures, the second direction being different than the first direction, wherein the plurality of first connection lines and the plurality of second connection lines include at least one of a curvy shape, a zig-zag shape, a wavy shape, a sinusoidal shape or a coiled shape.

23. The display device according to claim 22, wherein the plurality of first connection lines include a low potential voltage line, a scan signal line, a high potential voltage line and an emission signal line, and wherein the plurality of second connection lines include a plurality of data lines.

24. The display device according to claim 22, wherein a number of the plurality of first connection lines is less than a number of the plurality of second connection lines.

25. The display device according to claim 19, wherein areas between the plurality of island shaped structures have a modulus of elasticity that is greater than a modulus of elasticity of the plurality of island shaped structures.

* * * * *